United States Patent
Paek et al.

(10) Patent No.: US 9,881,980 B2
(45) Date of Patent: Jan. 30, 2018

(54) METHOD OF FABRICATING AN ORGANIC LIGHT EMITTING DIODE DISPLAY DEVICE INCLUDING A SELECTIVE MELTING AND DRYING PROCESS WITH AN ORGANIC SOLVENT

(71) Applicant: LG DISPLAY CO., LTD., Seoul (KR)

(72) Inventors: Seung-Han Paek, Bucheon-si (KR); Hyo-Dae Bae, Paju-si (KR); Young-Mu Oh, Seoul (KR); Jeong-Won Lee, Goyang-si (KR); Heon-Il Song, Paju-si (KR); Jong-Hoon Yeo, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/795,070

(22) Filed: Jul. 9, 2015

(65) Prior Publication Data
US 2016/0093680 A1    Mar. 31, 2016

(30) Foreign Application Priority Data
Sep. 26, 2014   (KR) .......................... 10-2014-0129522

(51) Int. Cl.
*H01L 27/32* (2006.01)
*H01L 51/52* (2006.01)

(52) U.S. Cl.
CPC ...... *H01L 27/3246* (2013.01); *H01L 51/5203* (2013.01); *H01L 51/5228* (2013.01)

(58) Field of Classification Search
None
See application file for complete search history.

(56) References Cited

U.S. PATENT DOCUMENTS

| | | | | |
|---|---|---|---|---|
| 2008/0165669 A1* | 7/2008 | New | .................... | G11B 23/40 369/275.5 |
| 2011/0253990 A1* | 10/2011 | Ishikawa | ............. | H01L 51/0003 257/40 |
| 2014/0147950 A1* | 5/2014 | Choi | .................... | H01L 51/0005 438/46 |

FOREIGN PATENT DOCUMENTS

| | | |
|---|---|---|
| CN | 101599534 A | 12/2009 |
| CN | 102655225 A | 9/2012 |
| JP | 2013-206629 A | 10/2013 |
| KR | 10-2011-0138787 A | 12/2011 |

* cited by examiner

*Primary Examiner* — Jay C Chang
(74) *Attorney, Agent, or Firm* — Birch, Stewart, Kolasch & Birch, LLP

(57) ABSTRACT

An organic light emitting diode display device, and method of fabricating an organic light emitting diode display device are discussed. The organic light emitting diode display device according to one embodiment includes a first electrode on a thin film transistor and connected to a drain electrode; an auxiliary electrode on a same layer as the first electrode; a bank layer covering edges of the first electrode and edges of the auxiliary electrode and having a transmissive hole corresponding and an auxiliary contact hole; a light emitting layer on the first electrode in the transmissive hole; a residual layer on the auxiliary electrode in the auxiliary contact hole. A central portion of the residual layer has a larger thickness than an edge portion of the residual layer. The organic light emitting diode display device further includes a second electrode on the light emitting layer and the residual layer.

6 Claims, 10 Drawing Sheets

METHOD OF FABRICATING AN ORGANIC LIGHT EMITTING DIODE DISPLAY DEVICE INCLUDING A SELECTIVE MELTING AND DRYING PROCESS WITH AN ORGANIC SOLVENT

CROSS-REFERENCE TO RELATED APPLICATION

The present application claims the priority benefit of Korean Patent Application No. 10-2014-0129522 filed in the Republic of Korea on Sep. 26, 2014, the entire contents of which are hereby incorporated by reference in their entirety.

BACKGROUND OF THE INVENTION

Field of the Disclosure

The present disclosure relates to an organic light emitting diode display device, and more particularly, to an organic light emitting diode display device and a method of fabricating the same. The organic light emitting diode display device provides uniform brightness and has a large size and high definition.

Description of the Related Art

Recently, flat panel displays have been widely developed and applied to various fields because of their thin profile, light weight, and low power consumption. Among the flat panel displays, organic light emitting diode (OLED) display devices, which can be referred to as organic electroluminescent display devices, emit light during loss of electron-hole pairs. The electron-hole pairs are formed by injecting charges into a light emitting layer between a cathode for injecting electrons and an anode for injecting holes.

The OLED display device can be self-luminous and include a flexible substrate such as plastic. The self-luminous OLED display device can have an excellent contrast ratio and a response time of several micro seconds. The self-luminous OLED display device has advantages in displaying moving images including a displaying the moving images at a wide viewing angle and being stable under low temperatures. The self-luminous OLED display device can be driven by a low voltage of direct current (DC) 5V to 15V, and, as a result, driving circuits in the OLED display can be easily designed and manufactured. In addition, manufacturing processes of the OLED display device can be simple because only deposition and encapsulation steps are required.

In addition, OLED display devices according to driving methods can be passive matrix type OLED display devices and active matrix type OLED display devices. Active matrix type display devices have low power consumption and high definition. In addition, the size of active matrix type display devices can be large.

FIG. 1 is a circuit diagram of one pixel region of an OLED display device according to the related art. The OLED display device includes a gate line GL, a data line DL, a switching thin film transistor Ts, a driving thin film transistor Td, a storage capacitor Cst and a light emitting diode De. The gate line GL and the data line DL cross each other to define a pixel region P. The switching thin film transistor Ts, the driving thin film transistor Td, the storage capacitor Cst and the light emitting diode De are formed in the pixel region P.

More particularly, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light emitting diode De is connected to a drain electrode of the driving thin film transistor Td, and a cathode of the light emitting diode De is connected to a low voltage supply VSS. The storage capacitor Cst is connected to the gate electrode and the drain electrode of the driving thin film transistor Td.

The OLED display device can be operated to turn on switching thin film transistor Ts by a gate signal applied through the gate line GL. The switching thin film transistor Ts can be turned on to apply a data signal from the data line DL to the gate electrode of the driving thin film transistor Td and an electrode of the storage capacitor Cst through the switching thin film transistor Ts. When the driving thin film transistor Td is turned on by the data signal, an electric current flowing through the light emitting diode De is controlled, thereby displaying an image. The light emitting diode De emits light due to the current supplied through the driving thin film transistor Td from the high voltage supply VDD.

Namely, the amount of the current flowing through the light emitting diode De is proportional to the magnitude of the data signal, and the intensity of light emitted by the light emitting diode De is proportional to the amount of the current flowing through the light emitting diode De. Thus, the pixel regions P show different gray levels depending on the magnitude of the data signal, and as a result, the OLED display device displays an image.

The storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light emitting diode De to be constant and the gray level shown by the light emitting diode De to be maintained until a next frame.

OLED display devices include bottom emission type OLED display devices and top emission type OLED display devices depending on an emission direction. In the bottom emission type OLED display devices, light emitted from the light emitting diode is output toward a substrate, where the thin film transistors are formed, through the anode. In the top emission type OLED display devices, light emitted from the light emitting diode is output toward a direction opposite to the substrate through the cathode.

In the OLED display devices, the thin film transistors, generally, are formed under the light emitting diode, and in the bottom emission type OLED display device, an effective emission area is limited by the thin film transistors. The top emission type OLED display device has a larger effective emission area than the bottom emission type OLED display device. Therefore, the top emission type OLED display device has a relatively high aperture ratio as compared with the bottom emission type OLED display device. In addition, the top emission type OLED display device can have a large size and high definition.

In addition, the cathode can be formed of a metallic material. In the top emission type OLED display device, the cathode needs to have a relatively thin thickness to output light through the cathode. As a result, a resistance of the cathode increases, and a VSS voltage drop occurs, thereby causing non-uniform brightness.

SUMMARY OF THE INVENTION

Accordingly, the present disclosure is directed to an organic light emitting diode display device and a method of fabricating the same that substantially obviate one or more of the problems due to limitations and disadvantages of the related art. An object of the present disclosure is to provide an organic light emitting diode display device having a large size, a high definition and a uniform brightness, and a method of fabricating the organic light emitting diode display device.

Additional features and advantages of these embodiments will be set forth in the description which follows, and in part will be apparent from the description, or can be learned by practice of the embodiments. The objectives and other advantages will be realized and attained by the structure particularly pointed out in the written description and claims hereof as well as the appended drawings.

To achieve these and other advantages and in accordance with the purpose of the present disclosure, as embodied and broadly described herein, according to one or more embodiments, an organic light emitting diode display device includes a substrate; a thin film transistor on the substrate; a first electrode connected to a drain electrode of the thin film transistor; an auxiliary electrode on a same layer as the first electrode; a bank layer covering edges of the first electrode and edges of the auxiliary electrode and having a transmissive hole corresponding to the first electrode and an auxiliary contact hole corresponding to the auxiliary electrode; a light emitting layer on the first electrode in the transmissive hole; a residual layer on the auxiliary electrode in the auxiliary contact hole. The residual layer has a thickness increasing from a central portion to an edge portion. The organic light emitting diode display device further includes a second electrode on the light emitting layer and the residual layer.

In another aspect, a method of fabricating an organic light emitting diode display device includes forming a thin film transistor on a substrate; forming a passivation layer on the thin film transistor; forming a first electrode and an auxiliary electrode on the passivation layer, the first electrode connected to a drain electrode of the thin film transistor, and the auxiliary electrode spaced apart from the first electrode; forming a bank layer having a transmissive hole exposing the first electrode and an auxiliary contact hole exposing the auxiliary electrode; sequentially forming a hole injecting material layer and a hole transporting material layer over substantially all of the substrate including the bank layer; forming a light emitting material layer on the hole transporting material layer corresponding to the transmissive hole; sequentially forming an electron transporting material layer and an electron injecting material layer over substantially all of the substrate including the light emitting material layer; melting and drying the electron injecting material layer, the electron transporting material layer, the hole transporting material layer and the hole injecting material layer corresponding to the auxiliary contact hole using an organic solvent, thereby forming a hole injecting layer, a hole transporting layer, an electron transporting layer and an electron injecting layer corresponding to the light emitting material layer and forming a residual layer on the auxiliary electrode in the auxiliary contact hole. The residual layer has a thickness increasing from a central portion to an edge portion. The method further includes forming a second electrode on the electron injecting layer and the residual layer.

In another aspect, a method of fabricating an organic light emitting diode display device includes forming a thin film transistor on a substrate; forming a passivation layer on the thin film transistor; forming a first electrode and an auxiliary electrode on the passivation layer, the first electrode connected to a drain electrode of the thin film transistor, and the auxiliary electrode spaced apart from the first electrode; forming a bank layer having a transmissive hole exposing the first electrode and an auxiliary contact hole exposing the auxiliary electrode; sequentially forming a hole injecting layer, a hole transporting layer and a first light emitting material layer on the first electrode exposed by the transmissive hole; sequentially forming a second light emitting material deposition layer, an electron transporting material layer and an electron injecting material layer over substantially all of the substrate including the first light emitting material layer; melting and drying the electron injecting material layer, the electron transporting material layer, and the second light emitting material deposition layer corresponding to the auxiliary contact hole using an organic solvent, thereby forming a second light emitting material layer, an electron transporting layer and an electron injecting layer corresponding to the first light emitting material layer and forming a residual layer on the auxiliary electrode in the auxiliary contact hole. The residual layer has a thickness increasing from a central portion to an edge portion. The method further includes forming a second electrode on the electron injecting layer and the residual layer.

It is to be understood that both the foregoing general description and the following detailed description are exemplary and explanatory. The foregoing general description and the following detailed description are intended to provide further explanation of the embodiments as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments, examples of which are illustrated in the accompanying drawings.

Figure 1:
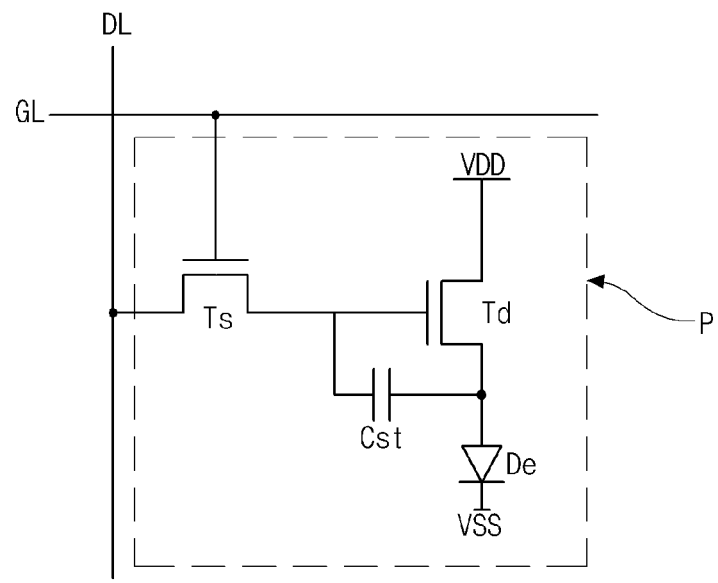
FIG. 1 is a circuit diagram of one pixel region of an OLED display device according to the related art.
Figure 2:
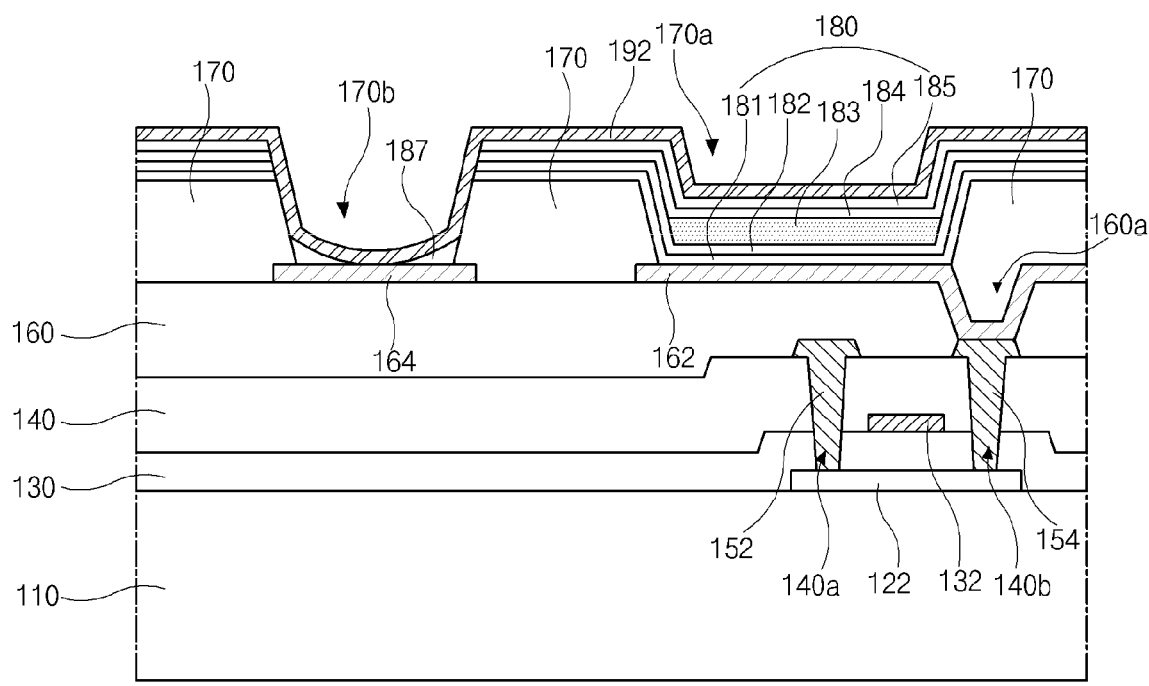
FIG. 2 is a cross-sectional view of an OLED display device according to a first embodiment of the present disclosure.

FIG. 2 is a cross-sectional view of an OLED display device according to a first embodiment of the present disclosure. The OLED display device according to the first embodiment includes one pixel region and a semiconductor layer 122 formed on an insulating substrate 110. The substrate 110 can be a glass substrate or a plastic substrate. The semiconductor layer 122 can be formed of an oxide semiconductor material. In addition, the OLED display device including the semiconductor layer 122 formed of an oxide semiconductor material can include a light-blocking pattern and a buffer layer formed under the semiconductor layer 122. The light-blocking pattern blocks light from the outside or light emitted from a light emitting diode to prevent the semiconductor layer 122 from being degraded by the light. Alternatively, the semiconductor layer 122 can be formed of polycrystalline silicon, and in this case, impurities can be doped in both ends of the semiconductor layer 122.

A gate insulating layer 130 of an insulating material is formed on the semiconductor layer 122 over substantially all of the substrate 110. The gate insulating layer 130 can be formed of an inorganic insulating material such as silicon oxide ($SiO_2$). When the semiconductor layer 122 is formed of polycrystalline silicon, the gate insulating layer 130 can be formed of an inorganic insulating material such as silicon oxide ($SiO_2$) and silicon nitride ($SiN_x$).

A gate electrode 132 of a conductive material such as metal can be formed on the gate insulating layer 130 to correspond to the semiconductor layer 122. In addition, a gate line and a first capacitor electrode can be formed on the gate insulating layer 130. The gate line extends in a first direction, and the first capacitor electrode can be connected to the gate electrode 132. In addition, the OLED display device according to the first embodiment of the present disclosure includes the gate insulating layer 130 formed over substantially all of the substrate 110. Alternatively, the gate insulating layer 130 can be patterned to have the same shape as the gate electrode 132.

An inter insulating layer 140 of an insulating material is formed on the gate electrode 132 over substantially all of the substrate 110. The inter insulating layer 140 can be formed of an inorganic insulating material such as silicon oxide ($SiO_2$) and silicon nitride ($SiN_x$) or an organic insulating material such as benzocyclobutene and photo acryl.

The inter insulating layer 140 includes first and second contact holes 140a and 140b exposing top surfaces of both sides of the semiconductor layer 122. The first and second contact holes 140a and 140b are spaced apart from the gate electrode 132, and the gate electrode 132 is disposed between the first and second contact holes 140a and 140b. The first and second contact holes 140a and 140b are also formed in the gate insulating layer 130. Alternatively, when the gate insulating layer 130 is patterned to have the same shape as the gate electrode 132, the first and second contact holes 140a and 140b are formed only in the inter insulating layer 140.

A source electrode 152 and a drain electrode 154 of a conductive material such as metal are formed on the inter insulating layer 140. In addition, a data line, a power supply line and a second capacitor electrode can be formed on the inter insulating layer 140. The data line and the power supply line extend in a second direction.

The source and drain electrodes 152 and 154 are spaced apart from each other with respect to the gate electrode 132. The source and drain electrodes 152 and 154 contact both sides of the semiconductor layer 122 through the first and second contact holes 140a and 140b, respectively. The data line can cross the gate line to define a pixel region. In addition, the power supply line can be spaced apart from the data line. The second capacitor electrode can be connected to the drain electrode 154 and can overlap the first capacitor electrode to form a storage capacitor with the inter insulating layer 140 therebetween as a dielectric substance.

In the OLED display device, a thin film transistor includes the semiconductor layer 122, the gate electrode 132, the source electrode 152 and the drain electrode 154. The thin film transistor can have a coplanar structure where the gate electrode 132 and the source and drain electrodes 152 and 154 are disposed at sides of the semiconductor layer 122, over the semiconductor layer 122.

Alternatively, the thin film transistor can have an inverted staggered structure where the gate electrode is disposed under the semiconductor layer and the source and drain electrodes are disposed over the semiconductor layer. In this case, the semiconductor layer can be formed of amorphous silicon. In addition, the thin film transistor can be a driving thin film transistor of the OLED display device. A switching thin film transistor can have the same structure as the driving thin film transistor formed over the substrate 110. At this time, the gate electrode 132 of the driving thin film transistor is connected to a drain electrode of the switching thin film transistor, and the source electrode 152 of the driving thin film transistor is connected to the power supply line. In addition, the gate electrode and the source electrode of the switching thin film transistor are connected to the gate line and the data line, respectively.

A passivation layer 160 of an insulating material is formed on the source and drain electrodes 152 and 154 over substantially all of the substrate 110. The passivation layer 160 has a flat top surface and has a drain contact hole 160a exposing the drain electrode 154. In FIG. 2, although the drain contact hole 160a is formed directly over the second contact hole 140b, the drain contact hole 160a can be spaced apart from the second contact hole 140b.

The passivation layer 160 can be formed of an organic insulating material such as benzocyclobutene and photo acryl. A first electrode 162 of a conductive material having a relatively high work function is formed on the passivation layer 160. The first electrode 162 is disposed in each pixel region and contacts the drain electrode 154 through the drain contact hole 160a. For example, the first electrode 162 can be formed of a transparent conductive material such as indium tin oxide (ITO) and indium zinc oxide (IZO).

The first electrode 162 can further include a reflective layer of an opaque conductive material. For example, the reflective layer can be formed of aluminum-paladium-copper (APC) alloy, and the first electrode 162 can have a triple-layered structure of ITO/APC/ITO.

In addition, an auxiliary electrode 164 is formed on the passivation layer 160 and spaced apart from the first electrode 162. The auxiliary electrode 164 can be formed of the same material as the first electrode 162. The auxiliary electrode 164 can extend in the first direction and the second direction over the substrate 110 and include an opening corresponding to each pixel region to have a lattice shape. The first electrode 162 can be disposed in the opening of the auxiliary electrode 164.

A bank layer 170 of an insulating material is formed on the first electrode 162 and the auxiliary electrode 164. The bank layer 170 has a transmissive hole 170a and an auxiliary contact hole 170b. The bank layer 170 covers edges of the first electrode 162 and edges of the auxiliary electrode 164. The transmissive hole 170a exposes the first electrode 162, and the auxiliary contact hole 170b exposes the auxiliary electrode 164.

A light emitting layer 180 is formed on the first electrode 162 exposed by the transmissive hole 170a of the bank layer 170. The light emitting layer 180 includes a hole injecting layer 181, a hole transporting layer 182, a light emitting material layer 183, an electron transporting layer 184, and an electron injecting layer 185 sequentially layered on the first electrode 162. The hole injecting layer 181, the hole transporting layer 182, the electron transporting layer 184 and the electron injecting layer 185 are formed over substantially all of the substrate 110 excluding the auxiliary contact hole 170b. The light emitting material layer 183 is formed only in the transmissive hole 170a. The light emitting material layer 183 can be one of red, green and blue light emitting material layers.

A residual layer 187 is formed in the auxiliary contact hole 170b. A central portion of the residual layer 187 is smaller than an edge portion thereof in the auxiliary contact hole 170b. The thickness of the edge portion of the residual layer 187 can be 1.1 times or more than the thickness of the central portion of the residual layer 187. Beneficially, the thickness of the edge portion of the residual layer 187 may be more than 10 times as thick as the thickness of the central portion of the residual layer 187. For example, the thickness of the central portion of the residual layer 187 can be less than 200 Å.

The hole injecting layer 181, the hole transporting layer 182, the light emitting material layer 183, the electron transporting layer 184 and the electron injecting layer 185 can be formed of an organic material. Alternatively, the electron injecting layer 185 can be formed of an inorganic material. The inorganic material, for example, can be sodium fluoride (NaF). In this case, the residual layer 187 substantially includes an inorganic material.

A second electrode 192 of a conductive material having relatively low work function is formed on the light emitting layer 180 over substantially all of the substrate 110. Here, the second electrode 192 can be formed of aluminum (Al), magnesium (Mg), silver (Ag) or their alloy. The second electrode 192 can have a relatively thin thickness such that light is transmitted therethrough. At this time, the transmittance of the second electrode 192 can be about 45 to 50%.

The second electrode 192 is electrically connected to the auxiliary electrode 164 through the auxiliary contact hole 170b. The second electrode 192 can directly contact the auxiliary electrode 164 or indirectly contact the auxiliary electrode 164 through the residual layer 187. The first electrode 162, the light emitting layer 180 and the second electrode 192 constitute an organic light emitting diode. The first electrode 162 functions as an anode, and the second electrode 192 serves as a cathode. Here, the OLED display device is a top emission type in which light from the light emitting layer 180 is output to the outside through the second electrode 192.

In the OLED display device according to the first embodiment of the present disclosure, the second electrode 192 is connected to the auxiliary electrode 164, and the resistance of the second electrode 192 is lowered. At this time, the second electrode 192 can be connected to the auxiliary electrode 164 through a simple process by removing the hole injecting layer 181, the hole transporting layer 182, the electron transporting layer 184, and the electron injecting layer 185 in the auxiliary contact hole 170b using an organic solvent.

When a thin film is disposed between the second electrode 192 and the auxiliary electrode 164, the electrical connection between the second electrode 192 and the auxiliary electrode 164 depending on the thickness of the thin film will be explained with reference to Table 1.

Table 1 shows resistance of the electron injecting layer between the auxiliary electrode and the second electrode.

TABLE 1

|  | NaF thickness | ITO/NaF/Ag resistance |
|---|---|---|
| S1 | 50 Å | 77 Ω |
| S2 | 300 Å | 101 Ω |
| S3 | 1000 Å | several MΩ |

For example, an ITO layer of 500 Å is formed over the substrate as the auxiliary electrode, a NaF layer of 50 Å (S1), 300 Å (S2) or 1,000 Å (S3) is formed over the ITO layer as the electron injecting layer, and an Ag layer of 500 Å is formed over the NaF layer as the second electrode. A resistance meter, which can be referred to as an ohmmeter, is connected to the ITO layer and the Ag layer, and the resistance between the ITO layer and the Ag layer is measured depending on the thickness of the NaF layer. Here, the NaF layer and the Ag layer can be formed by a deposition method, and prevent an electrical short between the Ag layer and the ITO layer, an insulating tape can be disposed in edges of an area where the NaF layer and the Ag layer are deposited.

As shown in Table 1, when the NaF layer 50 Å (S1), the resistance between the ITO layer and the Ag layer is 77 ohms, and when the NaF layer 300 Å (S2), the resistance between the ITO layer and the Ag layer is 101 ohms. Thus, it is noted that the ITO layer and the Ag layer are electrically connected to each other. On the other hand, when the NaF layer is 1,000 Å (S3), the resistance between the ITO layer and the Ag layer is several mega ohms, and the ITO layer and the Ag layer are not electrically connected to each other. Accordingly, although the residual layer 187 is disposed between the second electrode 192 and the auxiliary electrode 164, the thickness of the residual layer 187 is less than 200 Å, and the second electrode 192 and the auxiliary electrode 164 are electrically connected to each other.

Figure 3A:
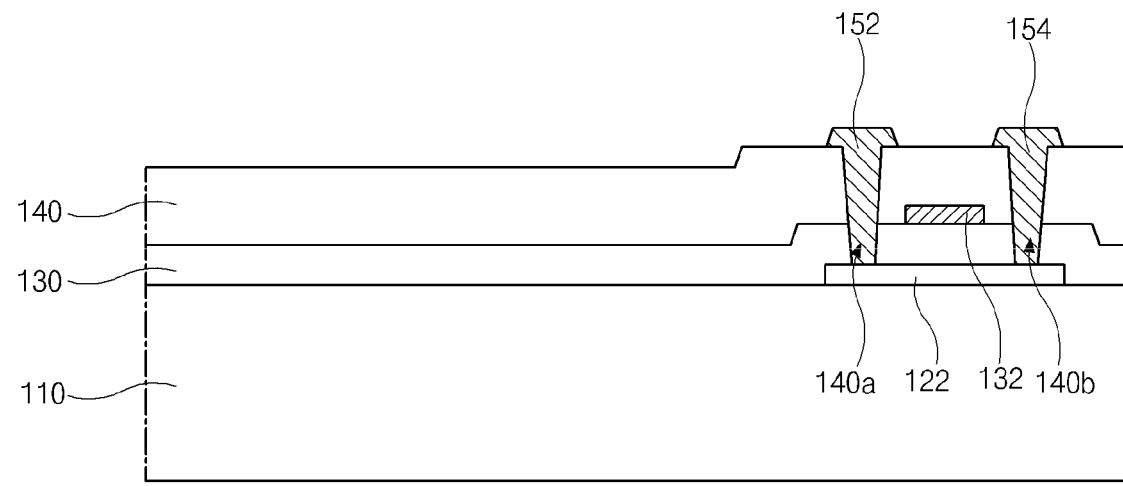
FIGS. 3A to 3H are cross-sectional views of an OLED display device in steps of fabricating the display device according to the first embodiment of the present disclosure.

Next, FIGS. 3A to 3H are cross-sectional views of an OLED display device in steps of fabricating the display device according to the first embodiment of the present disclosure. Referring to FIG. 3A, a semiconductor material layer can be formed on an insulating substrate 110 by depositing a semiconductor material, and the semiconductor material layer is selectively removed through a photolithographic process using a mask, thereby forming a semiconductor layer 122.

Here, the insulating substrate 110 can be a glass substrate or a plastic substrate. In addition, the semiconductor layer 122 can be formed of an oxide semiconductor material. The oxide semiconductor material can be indium gallium zinc oxide (IGZO), indium tin zinc oxide (ITZO), indium zinc oxide (IZO), zinc oxide (ZnO), indium gallium oxide (IGO) or indium aluminum zinc oxide (IAZO). At this time, a light-blocking pattern and a buffer layer can be further formed under the semiconductor layer 122. Alternatively, the semiconductor layer 122 can be formed of polycrystalline silicon, Next, a gate insulating layer 130 is formed on the semiconductor layers 122 by depositing an insulating material over substantially all of the substrate 110 by a chemical vapor deposition method, for example. The gate insulating layer 130 can be formed of an inorganic insulating material such as silicon oxide ($SiO_2$) and silicon nitride ($SiN_x$). When the semiconductor layer 122 is formed of an oxide semiconductor material, the gate insulating layer 130, beneficially, can be of silicon oxide ($SiO_2$).

Then, a first conductive material layer can be formed on the gate insulating layer 130 by depositing a conductive material such as metal by a sputtering method, for example, and the first conductive material layer can be selectively removed through a photolithographic process using a mask, thereby forming a gate electrode 132. The gate electrode 132 has a narrower width than the semiconductor layer 122 and is disposed to correspond to a central part of the semiconductor layer 122. The gate electrode 132 can be formed of at least one of aluminum (Al), copper (Cu), molybdenum (Mo), chromium (Cr), nickel (Ni), tungsten (W), and an alloy thereof.

A first capacitor electrode and a gate line are formed simultaneously with the gate electrode 132. The first capacitor electrode can be connected to the gate electrode 132, and the gate line can extend in a first direction. Next, an inter insulating layer 140 is formed on the gate electrode 132 by depositing or applying an insulating material over substantially all of the substrate 110, and the inter insulating layer 140 and the gate insulating layer 130 are selectively removed through a photolithographic process using a mask, thereby forming first and second contact holes 140a and 140b. The first and second contact holes 140a and 140b expose top surfaces of both sides of the semiconductor layer 122, respectively. The first and second contact holes 140a and 140b are spaced apart from the gate electrode 132, and the gate electrode 132 is disposed between the first and second contact holes 140a and 140b. The inter insulating layer 140 can be formed of an inorganic insulating material such as silicon oxide ($SiO_2$) and silicon nitride ($SiN_x$) or an organic insulating material such as benzocyclobutene and photo acryl.

Next, a second conductive material layer can be formed on the inter insulating layer 140 by depositing a conductive material such as metal by a sputtering method, for example, and the second conductive material layer can be selectively removed through a photolithographic process using a mask, thereby forming source and drain electrodes 152 and 154. The source and drain electrodes 152 and 154 are spaced apart from each other with respect to the gate electrode 132. The source and drain electrodes 152 and 154 contact both sides of the semiconductor layer 122 through the first and second contact holes 140a and 140b, respectively.

The source and drain electrodes 152 and 154 can be formed of at least one of aluminum (Al), copper (Cu), molybdenum (Mo), chromium (Cr), nickel (Ni), tungsten (W), and an alloy thereof. A data line, a second capacitor electrode and a power supply are formed simultaneously with the source and drain electrodes 152 and 154. The data line can extend in a second direction and cross the gate line to define a pixel region. The second capacitor electrode is connected to the drain electrode 154, and the power supply line is spaced apart from the data line.

Figure 3B:
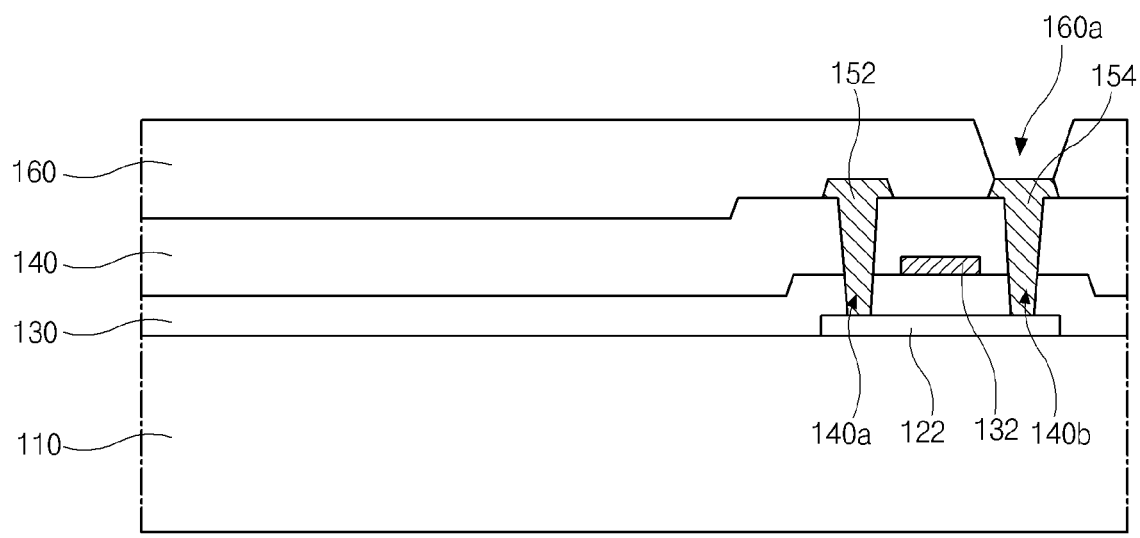

Referring to FIG. 3B, a passivation layer 160 is formed on the source and drain electrodes 152 and 154 by depositing or applying an insulating material over substantially all of the substrate 110, and the passivation layer 160 is selectively removed through a photolithographic process using a mask, thereby forming a drain contact hole 160a exposing the drain electrode 154. The drain contact hole 160a is formed directly over the second contact hole 140b. Alternatively, the drain contact hole 160a can be spaced apart from the second contact hole 140b.

The passivation layer 160 can be formed of an inorganic insulating material such as silicon oxide ($SiO_2$) and silicon nitride ($SiN_x$) or an organic insulating material such as benzocyclobutene and photo acryl. Beneficially, the passivation layer 160 can be formed of an organic insulating material to flatten a top surface thereof.

Figure 3C:
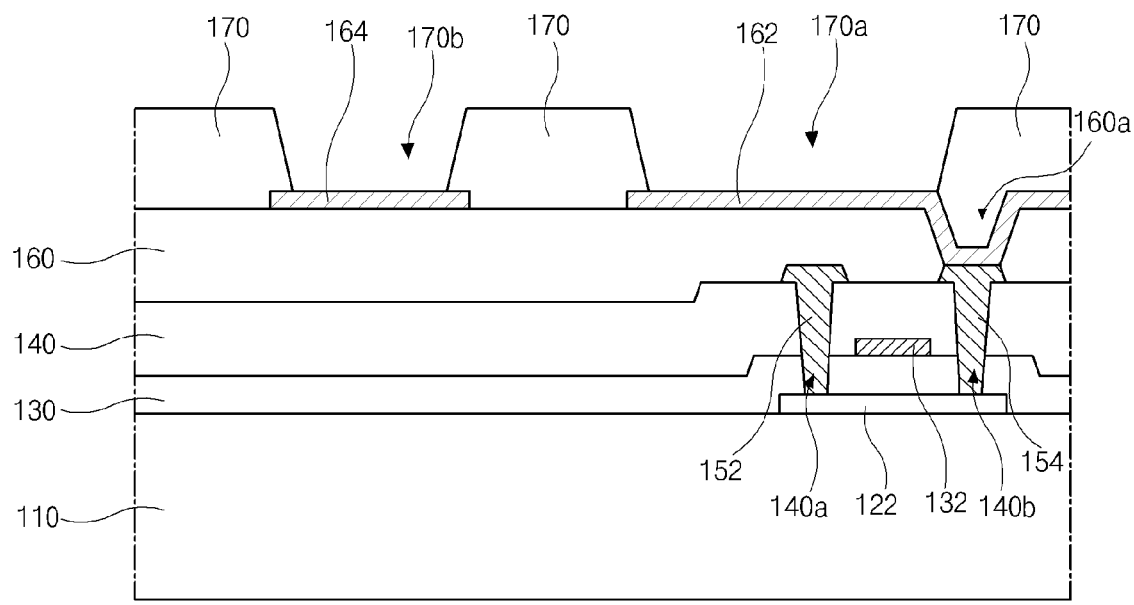

Referring to FIG. 3C, a first electrode material layer is formed on the passivation layer 160 by depositing a conductive material having relatively high work function by a sputtering method, for example, and the first electrode material layer is selectively removed through a photolithographic process using a mask, thereby forming a first electrode 162 and an auxiliary electrode 164. The first electrode 162 is disposed in each pixel region and is connected to the drain electrode 154 through the drain contact hole 160a. The auxiliary electrode 164 is spaced apart from the first electrode 162.

The first electrode 162 can include a transparent conductive layer and a reflective layer. The transparent conductive layer can be formed of a transparent conductive material such as indium tin oxide (ITO) and indium zinc oxide (IZO), and the reflective layer can be formed of aluminum-paladium-copper (APC) alloy. For example, the first electrode 162 and the auxiliary electrode 164 can have a triple-layered structure of ITO/APC/ITO.

Then, a bank material layer can be formed on the first electrode 162 and the auxiliary electrode 164 by depositing or applying an insulating material, and the bank material layer can be selectively removed through a photolithographic process using a mask, thereby forming a bank layer 170 having a transmissive hole 170a and an auxiliary contact hole 170b. The bank layer 170 covers edges of the first electrode 162 and edges of the auxiliary electrode 164, and the transmissive hole 170a and the auxiliary contact hole 170b expose the first electrode 162 and the auxiliary electrode 164, respectively.

Figure 3D:
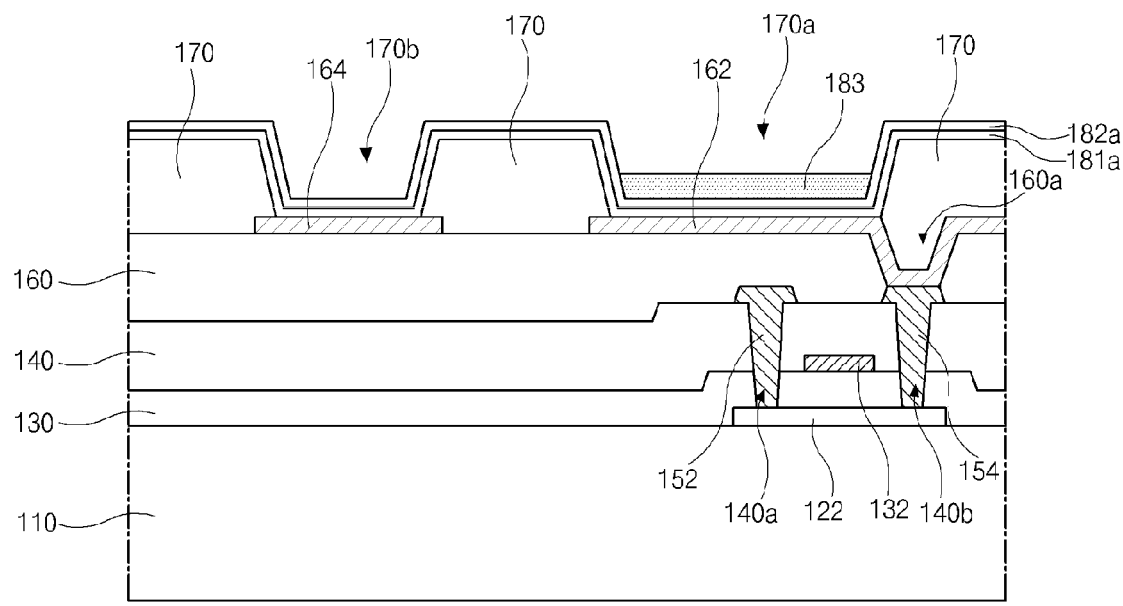

Referring to FIG. 3D, a hole injecting material layer 181a and a hole transporting material layer 182a are sequentially formed on the bank layer 170, the first electrode 162 and the auxiliary electrode 164 by vacuum depositing a hole injecting material and a hole transporting material over substantially all of the substrate 110. Then, a light emitting material layer 183 is formed in the transmissive hole 170a of the bank layer 170 by selectively vacuum depositing an organic light emitting material through a fine metal mask. At this time, the light emitting material layer 183 can be one of red, green or blue light emitting material layer, and the other light emitting material layers can be sequentially formed in the next pixel regions, respectively.

The light emitting material layer 183 of FIG. 3D, for example, can be a green light emitting material layer of a green pixel region. Therefore, the green light emitting material layer 183 is formed in the green pixel region by selectively vacuum depositing a green light emitting material through a first fine metal mask, a red light emitting material layer is formed in a red pixel region by selectively vacuum depositing a red light emitting material through a second fine metal mask, and a blue light emitting material layer is formed in a blue pixel region by selectively vacuum depositing a blue light emitting material through a third fine metal mask. The order of forming the red, green and blue light emitting material layers can be changed.

Figure 3E:
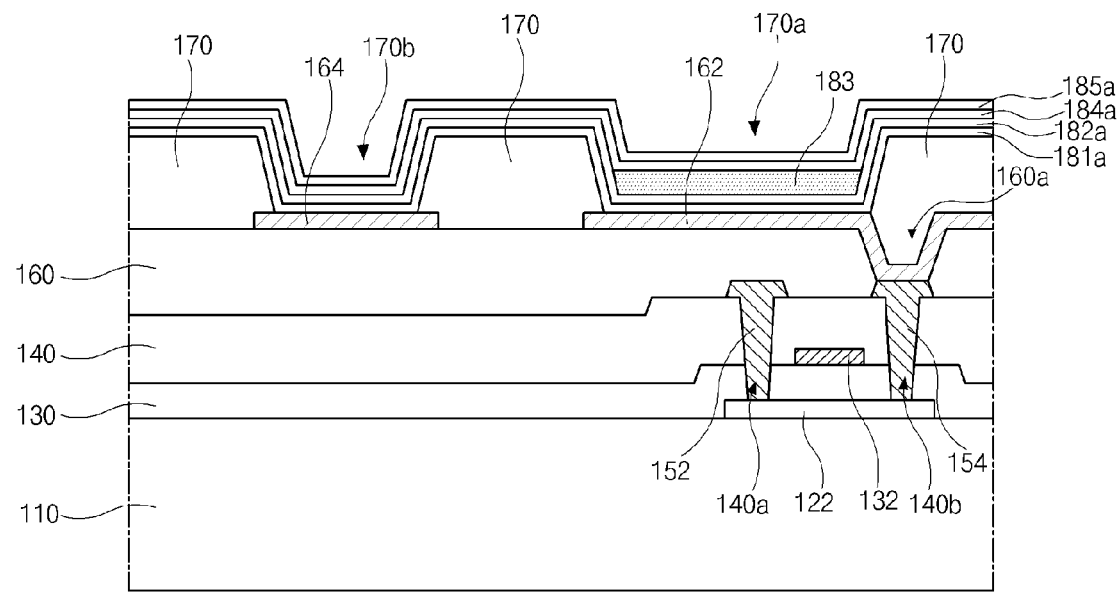

Referring to FIG. 3E, an electron transporting material layer 184a and an electron injecting material layer 185a are sequentially formed on the light emitting material layer 183 by vacuum depositing an electron transporting material and an electron injecting material over substantially all of the substrate 110. Therefore, the hole injecting material layer 181a, the hole transporting material layer 182a, the light emitting material layer 183, the electron transporting material layer 184a and the electron injecting material layer 185a are sequentially formed on the first electrode 162. The hole injecting material layer 181a, the hole transporting material layer 182a, the electron transporting material layer 184a and the electron injecting material layer 185a are sequentially formed on the auxiliary electrode 164. For example, the total thickness of the hole injecting material layer 181a, the hole transporting material layer 182a, the electron transporting material layer 184a and the electron injecting material layer 185a on the auxiliary electrode 164 can be less than about 2,000 Å.

The hole injecting material layer 181a, the hole transporting material layer 182a, the electron transporting material layer 184a and the electron injecting material layer 185a formed in each pixel region by the vacuum deposition method using a fine metal mask, in the OLED display device according to related art, can result in problems including the degree of accuracy in alignment of the mask and the substrate 110 and mass production. In addition, in the OLED display device according to related art, as the size of the substrate increases, the mask can sag.

Figure 3F:
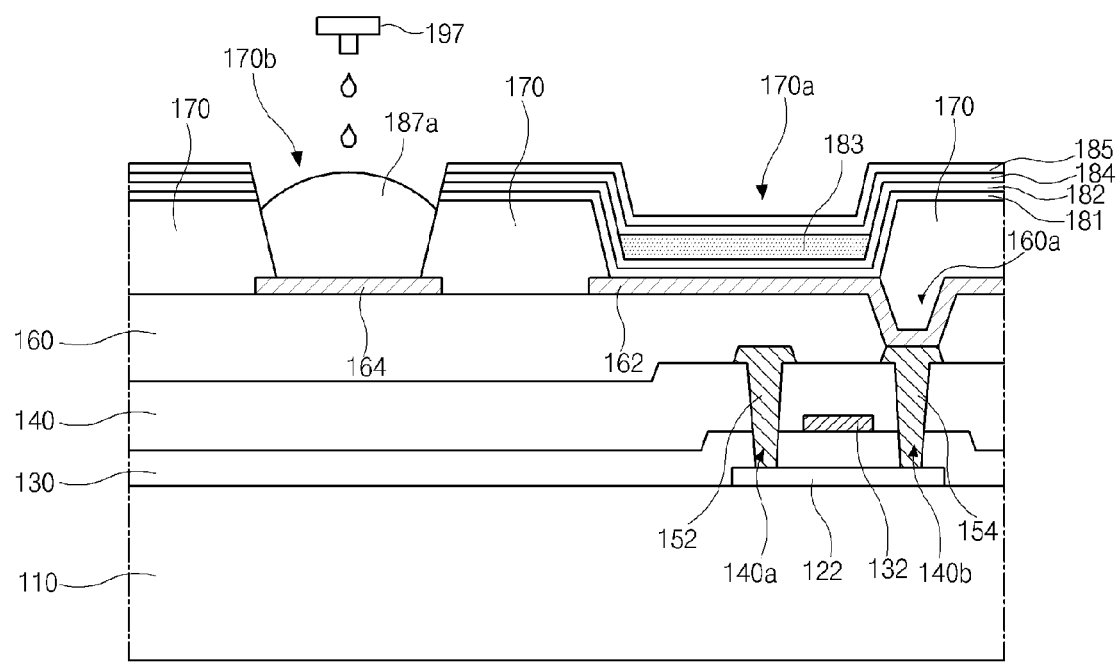

However, according to the first embodiment of the present disclosure, the hole injecting material layer 181a, the hole transporting material layer 182a, the electron transporting material layer 184a and the electron injecting material layer 185a are formed over substantially all of the substrate 110. Referring to FIG. 3F, common layers of the hole injecting material layer 181a (refer to FIG. 3E), the hole transporting material layer 182a (refer to FIG. 3E), the electron transporting material layer 184a (refer to FIG. 3E) and the electron injecting material layer 185a (refer to FIG. 3E) on the auxiliary electrode 164 in the auxiliary contact hole 170b are melted by injecting an organic solvent in the auxiliary contact hole 170b using an injecting apparatus 197.

Thus, materials of the common layers are dissolved in the organic solvent, thereby forming a common layer solution 187a in the auxiliary contact hole 170b. At this time, the organic solvent can be injected by an inkjet printing method or a nozzle printing method. The organic solvent can be one of ethylene glycol, 4-methylanisole, ethyl benzoate, isopropyl alcohol (IPA), acetone, and N-methyl pyrrolidone (NMP). Meanwhile, the hole injecting material layer 181a (refer to FIG. 3E), the hole transporting material layer 182a (refer to FIG. 3E), the electron transporting material layer 184a (refer to FIG. 3E) and the electron injecting material layer 185a (refer to FIG. 3E) on the first electrode 162 become a hole injecting layer 181, a hole transporting layer 182, an electron transporting layer 184 and an electron injecting layer 185, respectively.

Figure 3G:
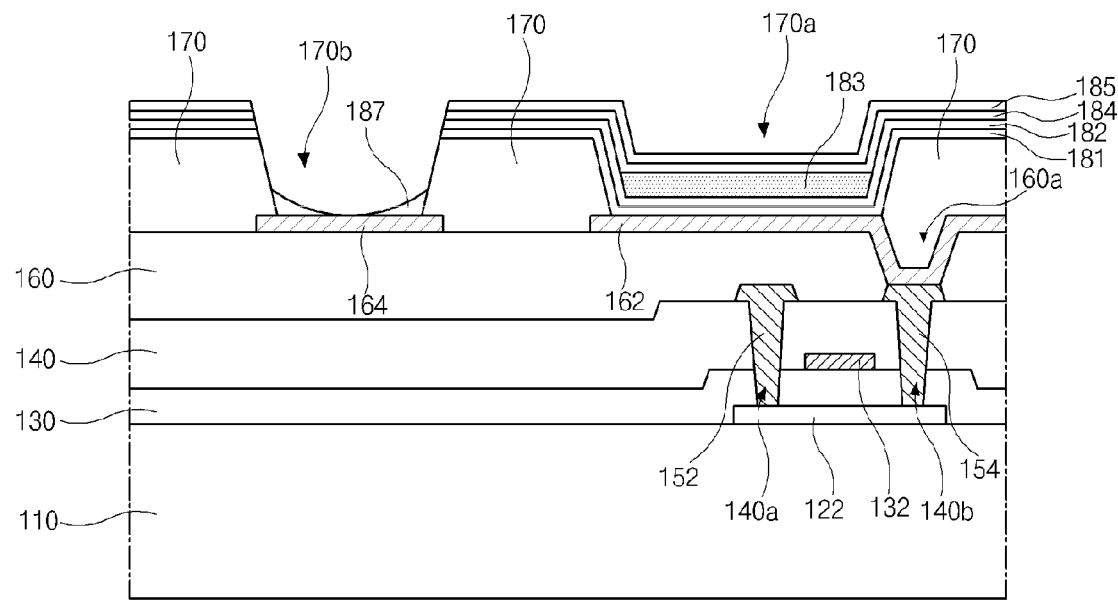

Referring to FIG. 3G, the common layer solution 187a (refer to FIG. 3F) is dried to volatilize the organic solvent and the materials of the common layers dissolved in the organic solvent. In addition, a residual layer 187 is formed on the auxiliary electrode 164 by the materials of the common layers not volatilized. At this time, the residual layer 187 has a thickness increasing from a central portion to an edge portion thereof due to a coffee stain effect or coffee ring effect. The thickness of the edge portion of the residual layer 187 can be 1.1 times or more than the thickness of the central portion of the residual layer 187. Beneficially, the edge portion of the residual layer 187 can be more than about 10 times as thick as the thickness of the central portion of the residual layer 187. Here, the thickness of the central portion of the residual layer 187 can be less than about 200 Å.

For example, the common layer solution 187a of FIG. 3F can be dried under the temperature of less than 150 degrees of Celsius for less than about 10 minutes. Beneficially, the common layer solution 187a can be dried under the temperature of 80 to 150 degrees of Celsius, and more beneficially, under the temperature of 100 to 150 degrees of Celsius. In the meantime, to faster dry, the common layer solution 187a can be dried faster under a vacuum of less than about 50 mTorr.

Figure 3H:
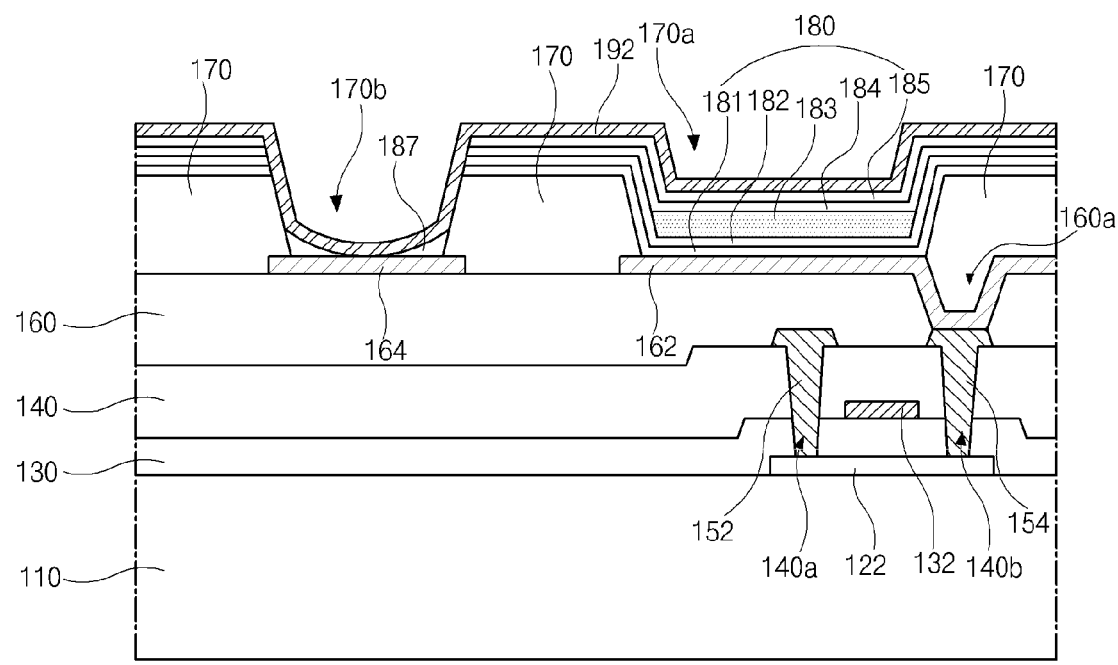

Referring to FIG. 3H, a second electrode 192 is formed on the electron injection layer 185 and the residual layer 187 by depositing a conductive material having a relatively low work function over substantially all of the substrate 110 by a sputtering method, for example. The second electrode 192 can be formed of a metallic material such as aluminum, magnesium and silver. The second electrode 192 has a relatively thin thickness such that light is transmitted therethrough.

Here, the second electrode 192 is electrically connected to the auxiliary electrode 164 through the auxiliary contact hole 170b. The second electrode 192 can directly contact the auxiliary electrode 164 or indirectly contact the auxiliary electrode 164 through the residual layer 187. Although the second electrode 192 is connected to the auxiliary electrode 164 through the residual layer 187, the second electrode 192 is electrically connected to the auxiliary electrode 164 because the thickness of the central portion of the residual layer 187 is less than about 200 Å.

The hole injecting layer 181, the hole transporting layer 182, the light emitting material layer 183, the electron transporting layer 184 and the electron injecting layer 185 form a light emitting layer 180, and the first electrode 162, the light emitting layer 180 and the second electrode 192 constitute an organic light emitting diode. The first electrode 162 functions as an anode, and the second electrode 192 serves as a cathode. Here, the OLED display device is a top emission type in which light from the light emitting layer 180 is output to the outside through the second electrode 192.

In the OLED display device according to the first embodiment of the present invention, the auxiliary electrode 164 is connected to the second electrode 192, and the resistance of the second electrode 192 is lowered. At this time, the auxiliary electrode 164 is formed through the same process as the first electrode 162, and an additional process for forming the auxiliary electrode 164 is not required. Additionally, the common layers on the auxiliary electrode 164 are removed by the organic solvent, and the auxiliary electrode 164 and the second electrode 192 can be electrically connected to each other through a simple process.

In the first embodiment of the present disclosure, the electron injecting material layer 185a (refer to FIG. 3E), the electron transporting material layer 184a (refer to FIG. 3E), the hole transporting material layer 182a (of FIG. 3E) and the hole transporting material layer 181a (of FIG. 3E) in the auxiliary contact hole 170b are completely melted and then dried, thereby electrically connecting the second electrode 192 and the auxiliary electrode 164. Alternatively, the electron injecting material layer 185a (refer to FIG. 3E), the electron transporting material layer 184a (refer to FIG. 3E), the hole transporting material layer 182a (refer to FIG. 3E) and the hole transporting material layer 181a (refer to FIG. 3E) in the auxiliary contact hole 170b can be partially melted and then dried, thereby electrically connecting the second electrode 192 and the auxiliary electrode 164.

Figure 4:
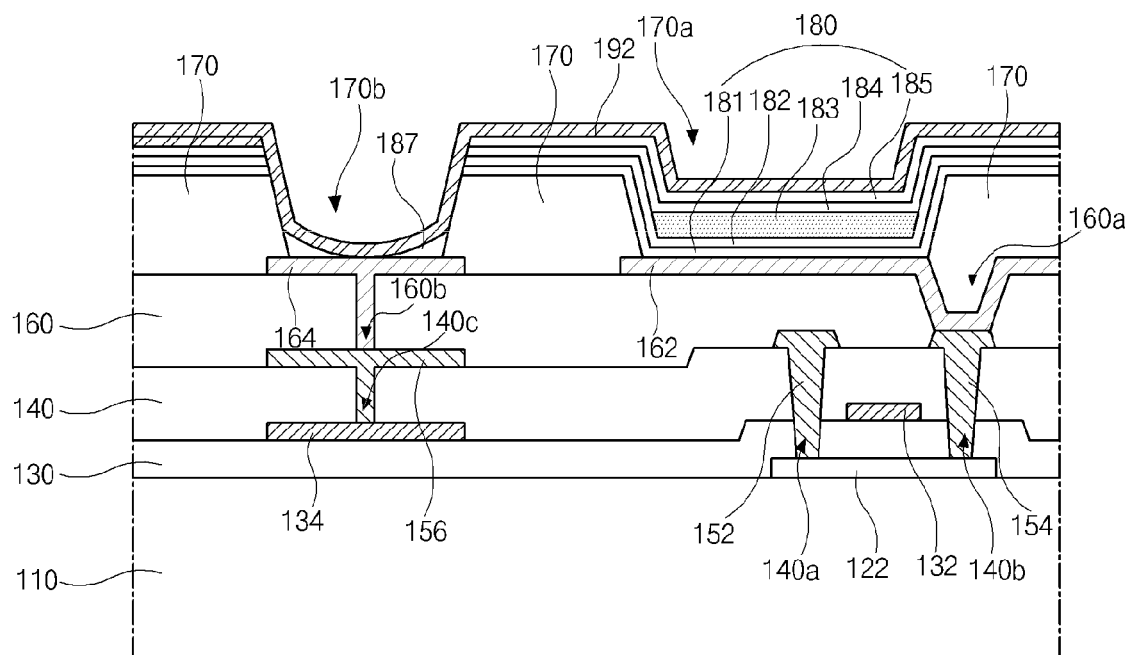
FIG. 4 is a cross-sectional view of an OLED display device according to a second embodiment of the present disclosure.

Next, FIG. 4 is a cross-sectional view of an OLED display device according to a second embodiment of the present disclosure. The display device of FIG. 4 has the same structure as the display device of FIG. 2 except for the auxiliary electrode. The same reference numbers will be used to refer to the same parts as the display device of FIG. 2, and explanations for the same parts will be omitted.

A first dummy electrode 134 is formed on the gate insulating layer 130. The first dummy electrode 134 can be formed of the same material and through the same process as the gate electrode 132. Next, the inter insulating layer 140 covers the first dummy electrode 134, and the inter insulating layer 140 further includes a third contact hole 140c exposing the first dummy electrode 134. A second dummy electrode 156 is formed on the inter insulating layer 140. The second dummy electrode 156 overlaps the first dummy electrode 134 and contacts the first dummy electrode 134 through the third contact hole 140c. The second dummy electrode 156 can be formed of the same material and through the same process as the source and drain electrodes 152 and 154.

Next, the passivation layer 160 covers the second dummy electrode 156 and has a fourth contact hole 160b exposing the second dummy electrode 156. An auxiliary electrode 164 is formed on the passivation layer 160. The auxiliary electrode 164 overlaps the second dummy electrode 156 and contacts the second dummy electrode 156 through the fourth contact hole 160b.

The bank layer 170 is formed on the auxiliary electrode 164. The bank layer 170 has an auxiliary contact hole 170b exposing the auxiliary electrode 164. The residual layer 187 is formed on the auxiliary electrode 164 by melting and drying the common layers. The second electrode 192 is formed over substantially all of the substrate 110 and is electrically connected to the auxiliary electrode 164 through the auxiliary contact hole 170b. The second electrode 192 can directly contact the auxiliary electrode 164 or indirectly contact the auxiliary electrode 164 through the residual layer 187.

The auxiliary electrode 164 can extend in the first direction and the second direction over the substrate 110 and include an opening corresponding to each pixel region to have a lattice shape. The first dummy electrode 134 can extend in the first direction, that is, parallel to the gate line and overlap the auxiliary electrode 164. The second dummy electrode 156 can extend in the second direction, that is, parallel to the data line and overlap the auxiliary electrode 164.

In the OLED display device according to the second embodiment of the present disclosure, the first and second dummy electrodes 134 and 156 are further formed and are electrically connected to the auxiliary electrode 164 and the second electrode 192. Therefore, the resistance of the second electrode 192 is further lowered as compared to the first embodiment, and the non-uniform brightness is improved. Here, one of the first and second dummy electrodes 134 and 156 can be omitted.

Figure 5:
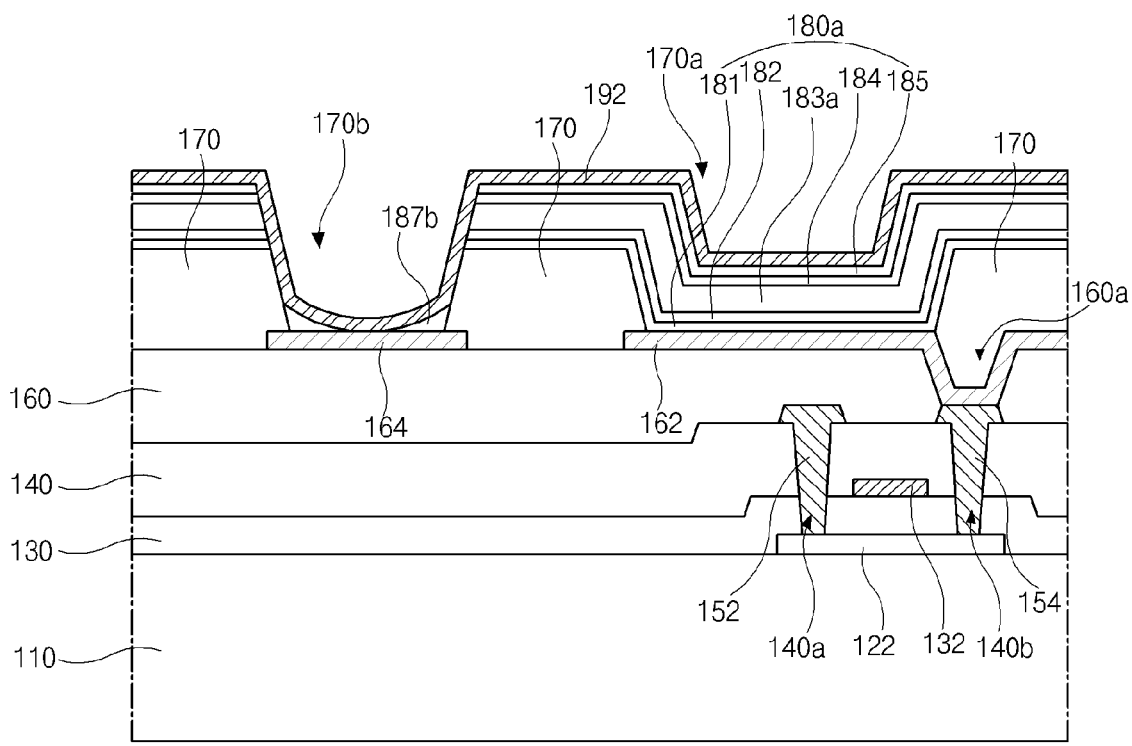
FIG. 5 is a cross-sectional view of an OLED display device according to a third embodiment of the present disclosure.

Next, FIG. 5 is a cross-sectional view of an OLED display device according to a third embodiment of the present disclosure. The display device of FIG. 5 has the same structure as the display device of FIG. 2 except for the light emitting layer. The same reference numbers will be used to refer to the same parts as the display device of FIG. 2, and explanations for the same parts will be omitted.

A light emitting layer 180a is formed on the first electrode 162 exposed by the transmissive hole 170a of the bank layer 170. The light emitting layer 180a includes a hole injecting layer 181, a hole transporting layer 182, a white light emitting material layer 183a, an electron transporting layer 184, and an electron injecting layer 185 sequentially layered on the first electrode 162. Here, the hole injecting layer 181, the hole transporting layer 182, the white light emitting material layer 183a, the electron transporting layer 184 and the electron injecting layer 185 are formed over substantially all of the substrate 110 excluding the auxiliary contact hole 170b.

The white light emitting material layer 183a emits white light. The white light emitting material layer 183a can include a single layer or more than two light emitting material layers emitting different color light. For example, the white light emitting material layer 183a can have a layered structure of red, green and blue light emitting material layers.

The hole injecting layer 181, the hole transporting layer 182, the white light emitting material layer 183a, the electron transporting layer 184 and the electron injecting layer 185 can be formed over substantially all of the substrate 110 by sequentially vacuum depositing a hole injecting material, a hole transporting material, a white light emitting material, an electron transporting material and an electron injecting material without a fine metal mask.

A residual layer 187b is formed in the auxiliary contact hole 170b. The residual layer 187b has a thickness increasing from a central portion to an edge portion thereof in the auxiliary contact hole 170b. The thickness of the edge portion of the residual layer 187b can be 1.1 times or more than the thickness of the central portion of the residual layer 187b. Beneficially, the thickness of the edge portion of the residual layer 187 can be more than 10 times as thick as the thickness of the central portion of the residual layer 187b. For example, the thickness of the central portion of the residual layer 187b can be less than 300 Å.

The OLED display device according to the third embodiment of the present disclosure includes red, green and blue color filters (not shown). The color filters can be formed over the substrate 110 or over a counterpart substrate attached with the substrate 110 later.

In the meantime, the OLED display device according to the third embodiment of the present disclosure can further include the first and second dummy electrodes connected to the auxiliary electrode 164 similarly to the display device of FIG. 4.

Figure 6:
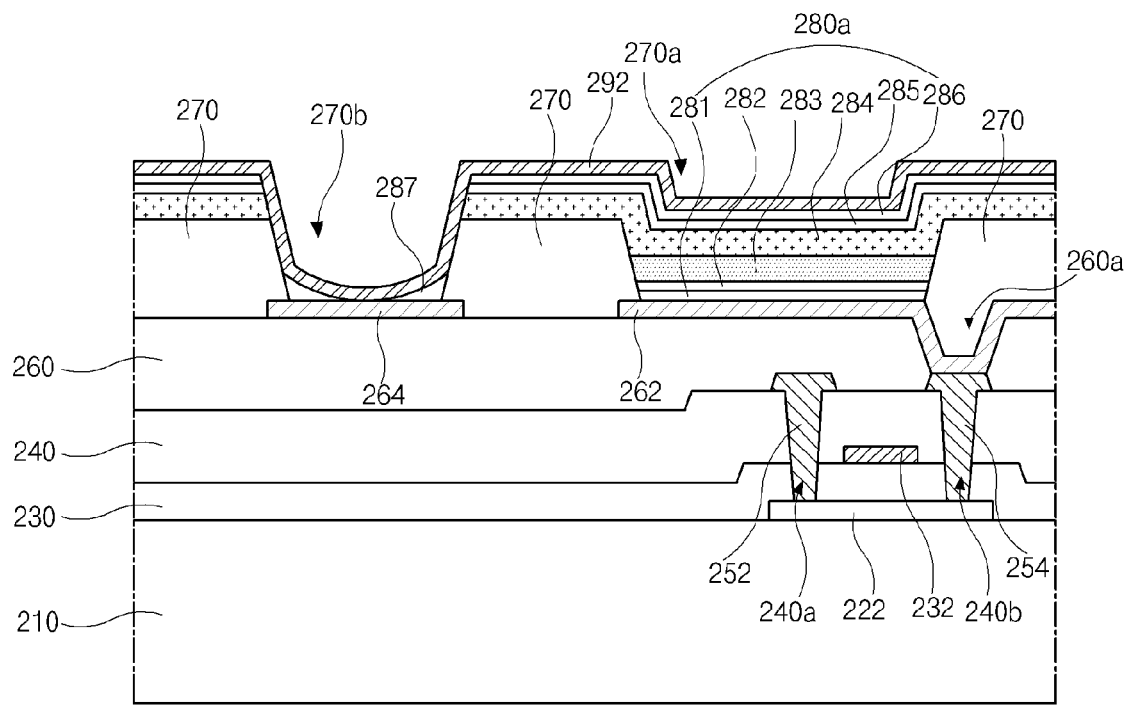
FIG. 6 and FIG. 7 are cross-sectional views of an OLED display device according to a fourth embodiment of the present disclosure.
Figure 7:
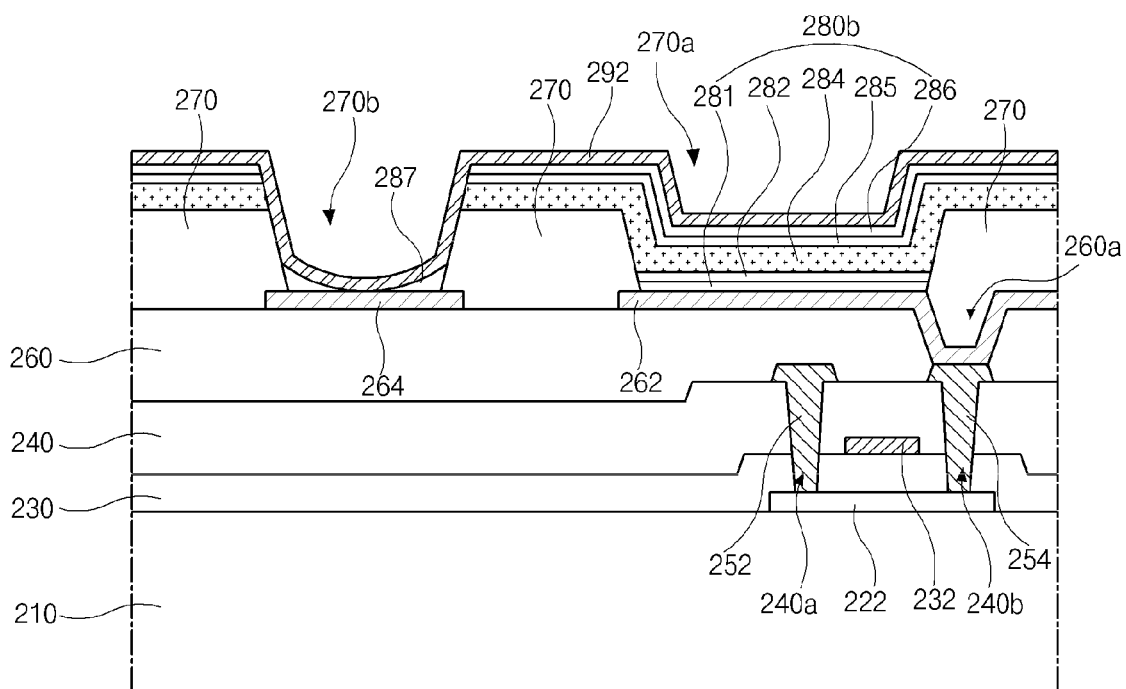

Next, FIG. 6 and FIG. 7 are cross-sectional views of an OLED display device according to a fourth embodiment of the present disclosure. FIG. 6 shows a structure corresponding to a red or green pixel region, and FIG. 7 shows a structure corresponding to a blue pixel region. Here, the similar reference numbers will be used to refer to the similar parts or same parts as the first embodiment, and explanations for the same parts will be simplified.

A semiconductor layer 222 is formed in each pixel region on an insulating substrate 210. A gate insulating layer 230 of an insulating material is formed over substantially all of the substrate 210.

A gate electrode 232 of a conductive material such as metal is formed on the gate insulating layer 230 to correspond to the semiconductor layer 222. In addition, a gate line and a first capacitor electrode can be formed on the gate insulating layer 230. The gate line extends in a first direction, and the first capacitor electrode is connected to the gate electrode 232.

An inter insulating layer 240 of an insulating material is formed on the gate electrode 232 over substantially all of the substrate 210. The inter insulating layer 240 has first and second contact holes 240a and 240b exposing top surfaces of both sides of the semiconductor layer 222. The first and second contact holes 240a and 240b are spaced apart from the gate electrode 232, and the gate electrode 232 is disposed between the first and second contact holes 240a and 240b. The first and second contact holes 240a and 240b also can be formed in the gate insulating layer 230.

A source electrode 252 and a drain electrode 254 of a conductive material such as metal are formed on the inter insulating layer 240. In addition, a data line, a power supply line and a second capacitor electrode can be formed on the inter insulating layer 240. The data line and the power supply line extend in a second direction.

The source and drain electrodes 252 and 254 are spaced apart from each other with respect to the gate electrode 232. The source and drain electrodes 252 and 254 contact both sides of the semiconductor layer 222 through the first and second contact holes 240a and 240b, respectively. The data line crosses the gate line to define a pixel region, and the power supply line is spaced apart from the data line. The second capacitor electrode is connected to the drain electrode 254 and overlaps the first capacitor electrode to form a storage capacitor with the inter insulating layer 240 therebetween as a dielectric substance.

In the meantime, the semiconductor layer 222, the gate electrode 232, the source electrode 252 and the drain electrode 254 constitute a thin film transistor. A passivation layer 260 of an insulating material is formed on the source and drain electrodes 252 and 254 over substantially all of the substrate 210. The passivation layer 260 has a flat top surface and has a drain contact hole 260a exposing the drain electrode 254. Although the drain contact hole 260a is formed directly over the second contact hole 240b (refer to FIGS. 6 and 7), the drain contact hole 260a can be spaced apart from the second contact hole 240b.

A first electrode 262 of a conductive material having relatively high work function is formed on the passivation layer 260. The first electrode 262 is disposed in each pixel region and contacts the drain electrode 254 through the drain contact hole 260a. For example, the first electrode 262 can be formed of a transparent conductive material such as indium tin oxide (ITO) and indium zinc oxide (IZO).

Meanwhile, the first electrode 262 can further include a reflective layer of an opaque conductive material. For example, the reflective layer can be formed of aluminum-paladium-copper (APC) alloy, and the first electrode 262 can have a triple-layered structure of ITO/APC/ITO.

Additionally, an auxiliary electrode 264 is formed on the passivation layer 260 and spaced apart from the first electrode 262. The auxiliary electrode 264 can be formed of the same material as the first electrode 262. The auxiliary electrode 264 can extend in the first direction in which the gate line extends and in the second direction in which the data line and the power supply line extend. In addition, the auxiliary electrode 264 can include an opening corresponding to each pixel region to have a lattice shape. The first electrode 262 can be disposed in the opening of the auxiliary electrode 264.

A bank layer 270 of an insulating material is formed on the first electrode 262 and the auxiliary electrode 264. The bank layer 270 has a transmissive hole 270a and an auxiliary contact hole 270b. The bank layer 270 covers edges of the first electrode 262 and edges of the auxiliary electrode 264. The transmissive hole 270a exposes the first electrode 262, and the auxiliary contact hole 270b exposes the auxiliary electrode 264.

A light emitting layer 280a or 280b is formed on the first electrode 262 exposed by the transmissive hole 270a of the bank layer 270. A first light emitting layer 280a is formed in the red or green pixel region, and a second light emitting layer 280b is formed in the blue pixel region.

The first light emitting layer 280a includes a hole injecting layer 281, a hole transporting layer 282, a first light emitting material layer 283, a second light emitting material layer 284, an electron transporting layer 285, and an electron injecting layer 286 sequentially layered on the first electrode 262. The second light emitting layer 280b includes a hole injecting layer 281, a hole transporting layer 282, a second light emitting material layer 284, an electron transporting layer 285, and an electron injecting layer 286 sequentially layered on the first electrode 262. The first light emitting material layer 283 can be a red or green light emitting material layer, and the second light emitting material layer 284 can be a blue light emitting material layer.

Here, the hole injecting layer 281, the hole transporting layer 282 and the first light emitting material layer 283 are formed only in the transmissive hole 270a, and the second light emitting material layer 284, the electron transporting layer 285 and the electron injecting layer 286 are formed over substantially all of the substrate 210 excluding the auxiliary contact hole 270b.

Namely, the second light emitting material layer 284 is formed in the red, green and blue pixel regions. In the red and green pixel regions, the second light emitting material layer 284 functions as a hole blocking layer, and in the blue pixel region, the second light emitting material layer 284 serves as a blue light emitting material layer.

In the meantime, a residual layer 287 is formed in the auxiliary contact hole 270b. The residual layer 287 has a thickness increasing from a central portion to an edge portion thereof in the auxiliary contact hole 270b. The thickness of the edge portion of the residual layer 287 can be 1.1 times or more than the thickness of the central portion of the residual layer 287. Beneficially, the thickness of the edge portion of the residual layer 287 can be more than 10 times as thick as the thickness of the central portion of the residual layer 287. For example, the thickness of the central portion of the residual layer 287 can be less than 50 Å.

A second electrode 292 of a conductive material having a relatively low work function is formed on the light emitting layer 280a or 280b over substantially all of the substrate 210. Here, the second electrode 292 can be formed of aluminum (Al), magnesium (Mg), silver (Ag) or their alloy. The second electrode 292 can have a relatively thin thickness such that light is transmitted therethrough. At this time, the transmittance of the second electrode 292 can be about 45 to 50%.

The second electrode 292 is electrically connected to the auxiliary electrode 264 through the auxiliary contact hole 270b. The second electrode 292 can directly contact the auxiliary electrode 264 or indirectly contact the auxiliary electrode 264 through the residual layer 287.

The first electrode 262, the light emitting layer 280a or 280b and the second electrode 292 constitute an organic light emitting diode. The first electrode 262 functions as an anode, and the second electrode 292 serves as a cathode. Here, the OLED display device is a top emission type in which light from the light emitting layer 280a or 280b is output to the outside through the second electrode 292.

In the OLED display device according to the fourth embodiment of the present disclosure, the second electrode 292 is connected to the auxiliary electrode 264, and the resistance of the second electrode 292 is lowered. At this time, the second electrode 292 can be connected to the auxiliary electrode 264 through a simple process by removing common layers in the auxiliary contact hole 270b using an organic solvent.

The OLED display device according to the fourth embodiment of the present disclosure can further include the first and second dummy electrodes connected to the auxiliary electrode 264 similarly to the display device of FIG. 4.

Next, FIGS. 8A to 8F are cross-sectional views of an OLED display device in steps of fabricating the display device according to the fourth embodiment of the present disclosure. FIGS. 8A to 8F show a structure corresponding to the red or green pixel region of FIG. 6. Here, explanations for the similar steps as in the first embodiment will be simplified.

Figure 8A:
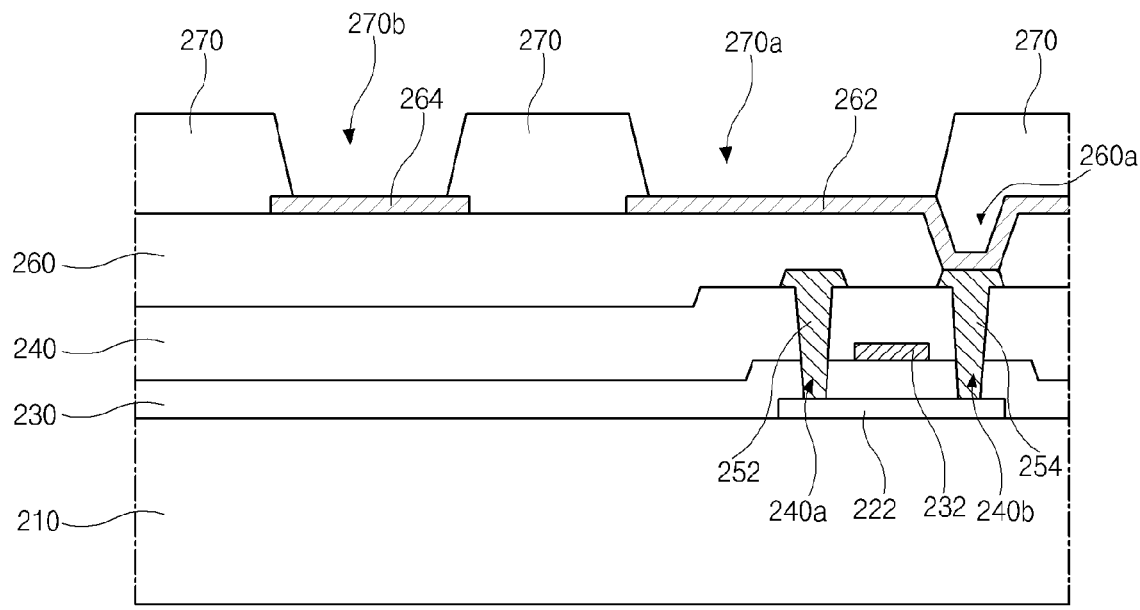
FIGS. 8A to 8F are cross-sectional views of an OLED display device in steps of fabricating the display device according to the fourth embodiment of the present disclosure.

Referring to FIG. 8A, a semiconductor material layer is formed on an insulating substrate 210 by depositing a semiconductor material, and the semiconductor material layer is selectively removed through a photolithographic process using a mask, thereby forming a semiconductor layer 222. Next, a gate insulating layer 230 is formed on the semiconductor layers 222 by depositing an insulating material over substantially all of the substrate 210 by, for example, a chemical vapor deposition method.

Then, a first conductive material layer is formed on the gate insulating layer 230 by depositing a conductive material such as metal. In particular, the first conductive material layer can be formed on the gate insulating layer 230 via, for example, a sputtering method. The first conductive material layer is selectively removed through a photolithographic process using a mask, thereby forming a gate electrode 232. The gate electrode 232 has a narrower width than the semiconductor layer 222 and is disposed to correspond to a central part of the semiconductor layer 222. Meanwhile, a first capacitor electrode and a gate line are formed simultaneously with the gate electrode 232. The first capacitor electrode can be connected to the gate electrode 232, and the gate line can extend in a first direction.

Next, an inter insulating layer 240 is formed on the gate electrode 232 by depositing or applying an insulating material over substantially all of the substrate 210, and the inter insulating layer 240 and the gate insulating layer 230 are selectively removed through a photolithographic process using a mask, thereby forming first and second contact holes 240a and 240b. The first and second contact holes 240a and 240b expose top surfaces of both sides of the semiconductor layer 222, respectively. The first and second contact holes 240a and 240b are spaced apart from the gate electrode 232, and the gate electrode 232 is disposed between the first and second contact holes 240a and 240b.

Next, a second conductive material layer is formed on the inter insulating layer 240 by depositing a conductive material such as metal by a sputtering method, for example, and the second conductive material layer is selectively removed through a photolithographic process using a mask, thereby forming source and drain electrodes 252 and 254. The source and drain electrodes 252 and 254 are spaced apart from each other with respect to the gate electrode 232. The source and drain electrodes 252 and 254 contact both sides of the semiconductor layer 222 through the first and second contact holes 240a and 240b, respectively.

In the meantime, a data line, a second capacitor electrode and a power supply line are formed simultaneously with the source and drain electrodes 252 and 254. Although not shown in the figure, the data line extends in a second direction and crosses the gate line to define a pixel region. The second capacitor electrode is connected to the drain electrode 254, and the power supply line is spaced apart from the data line.

Next, a passivation layer 260 is formed on the source and drain electrodes 252 and 254 by depositing or applying an insulating material over substantially all of the substrate 210. In addition, the passivation layer 260 is selectively removed through a photolithographic process using a mask, thereby forming a drain contact hole 260a exposing the drain electrode 254.

Next, a first electrode material layer can be formed on the passivation layer 260 by depositing a conductive material having relatively high work function. In particular, the first electrode material layer can be formed on the passivation layer 260 by, for example, a sputtering method, for example. The first electrode material layer is selectively removed through a photolithographic process using a mask, thereby forming a first electrode 262 and an auxiliary electrode 264. The first electrode 262 is disposed in each pixel region and is connected to the drain electrode 254 through the drain contact hole 260a. The auxiliary electrode 264 is spaced apart from the first electrode 262.

The first electrode 262 can include a transparent conductive layer and a reflective layer. The transparent conductive layer can be formed of a transparent conductive material such as indium tin oxide (ITO) and indium zinc oxide (IZO), and the reflective layer can be formed of aluminum-paladium-copper (APC) alloy. For example, the first electrode 262 and the auxiliary electrode 264 can have a triple-layered structure of ITO/APC/ITO.

Then, a bank material layer (not shown) is formed on the first electrode 262 and the auxiliary electrode 264 by depositing or applying an insulating material. The bank material layer is selectively removed through a photolithographic process using a mask, thereby forming a bank layer 270 having a transmissive hole 270a and an auxiliary contact hole 270b. The bank layer 270 covers edges of the first electrode 262 and edges of the auxiliary electrode 264, and the transmissive hole 270a and the auxiliary contact hole 270b expose the first electrode 262 and the auxiliary electrode 264, respectively.

Figure 8B:
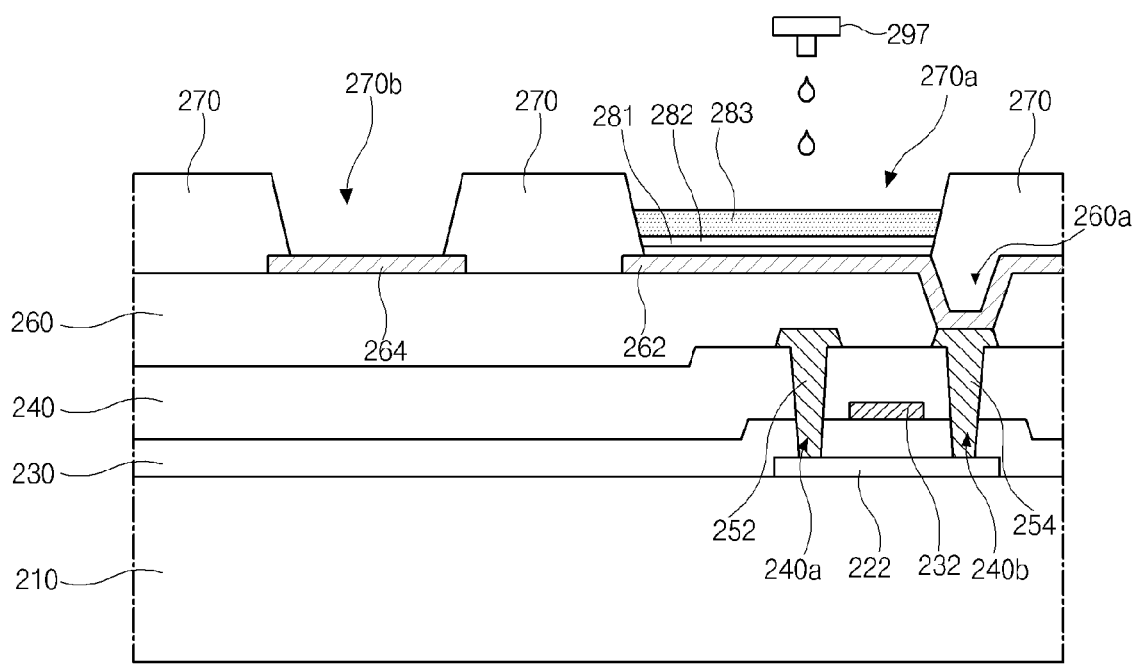

Referring to FIG. 8B, a hole injecting layer 281, a hole transporting layer 282 and a first light emitting material layer 283 are sequentially formed on the first electrode 262 exposed by the transmissive hole 270a by applying a hole injecting material, a hole transporting material and a first light emitting material through a solution process using a first injecting apparatus 297. The solution process can include a printing method or a coating method. For example, the solution process can include an inkjet printing method or a nozzle printing method.

Here, the first light emitting material layer 283 of FIG. 8B can be one of red and green light emitting material layers, and another light emitting material layer can be formed in the next pixel region. For instance, the first light emitting material layer 283 of FIG. 8B can be a green light emitting material layer of the green pixel region. Thus, the green light emitting material layer 283 is formed in the green pixel region by applying a green light emitting material through a solution process. A red light emitting material layer can be formed in the red pixel region by applying a red light emitting material through a solution process. The order of forming the red and green light emitting material layers can be changed.

Figure 8C:
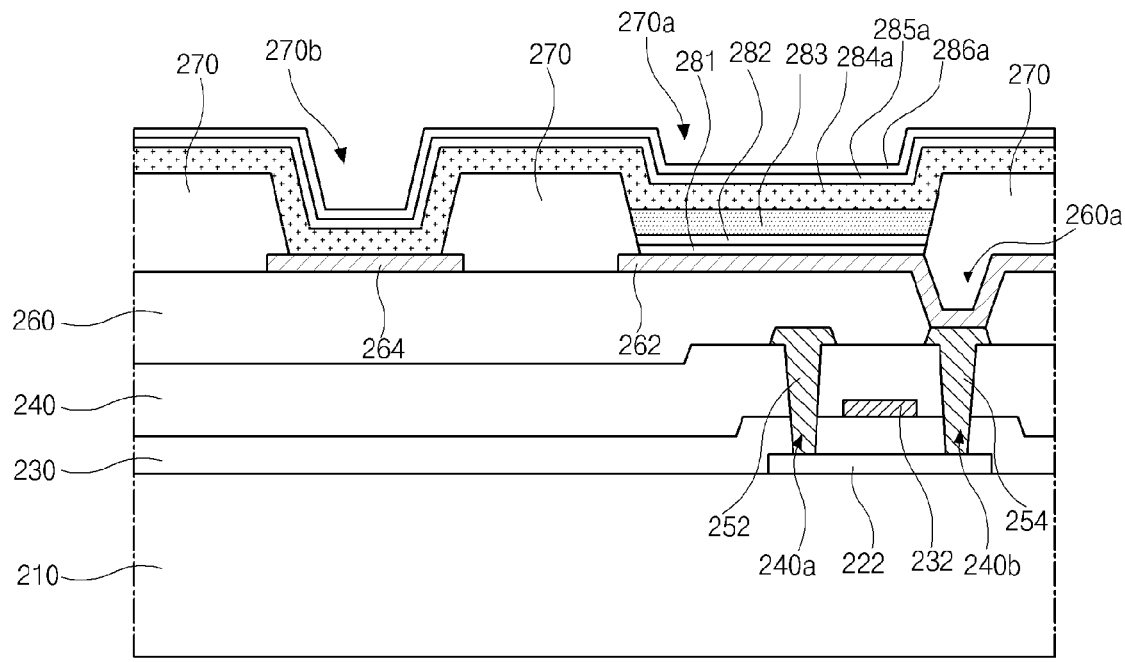

Referring to FIG. 8C, a second light emitting material deposition layer 284a is formed on the first light emitting material layer 283 by vacuum depositing a second light emitting material, i.e., a blue light emitting material over substantially all of the substrate 210. Then, an electron transporting material layer 285a and an electron injecting material layer 286 are sequentially formed on the second light emitting material deposition layer 284a by vacuum depositing an electron transporting material and an electron injecting material over substantially all of the substrate 210.

Therefore, in each of the red and green pixel regions, the hole injecting layer 281, the hole transporting layer 282, the first light emitting material layer 283, the second light emitting material deposition layer 284a, the electron transporting material layer 285a and the electron injecting material layer 286a are sequentially formed on the first electrode 262, and common layers of the second light emitting material deposition layer 284a, the electron transporting material layer 285a, and the electron injecting material layer 286a are sequentially formed on the auxiliary electrode 264. For example, the total thickness of the second light emitting material deposition layer 284a, the electron transporting material layer 285a and the electron injecting material layer 286a on the auxiliary electrode 264 can be less than about 500 Å.

Meanwhile, in the blue pixel region, the hole injecting layer 281, the hole transporting layer 282, the second light emitting material deposition layer 284a, the electron transporting material layer 285a and the electron injecting material layer 286a are sequentially formed on the first electrode 262, and the second light emitting material deposition layer 284a, the electron transporting material layer 285a, and the electron injecting material layer 286a are sequentially formed on the auxiliary electrode 264.

In the fourth embodiment of the present disclosure, the hole injecting layer 281, the hole transporting layer 282, and the first light emitting material layer 283 of red or green are formed through the solution process, and the second light emitting material deposition layer 284a of blue, the electron transporting material layer 285a and the electron injecting material layer 286a are formed over substantially all of the substrate 210 by the vacuum deposition method. Thus, problems such as the degree of accuracy in alignment of the mask and the substrate 210 and mass production can be prevented. In addition, it is prevented that the mask sags. The light emitting layer 280a of FIG. 6 or 280b of FIG. 7 can be uniformly formed even if the size of the substrate 210 increases.

Figure 8D:
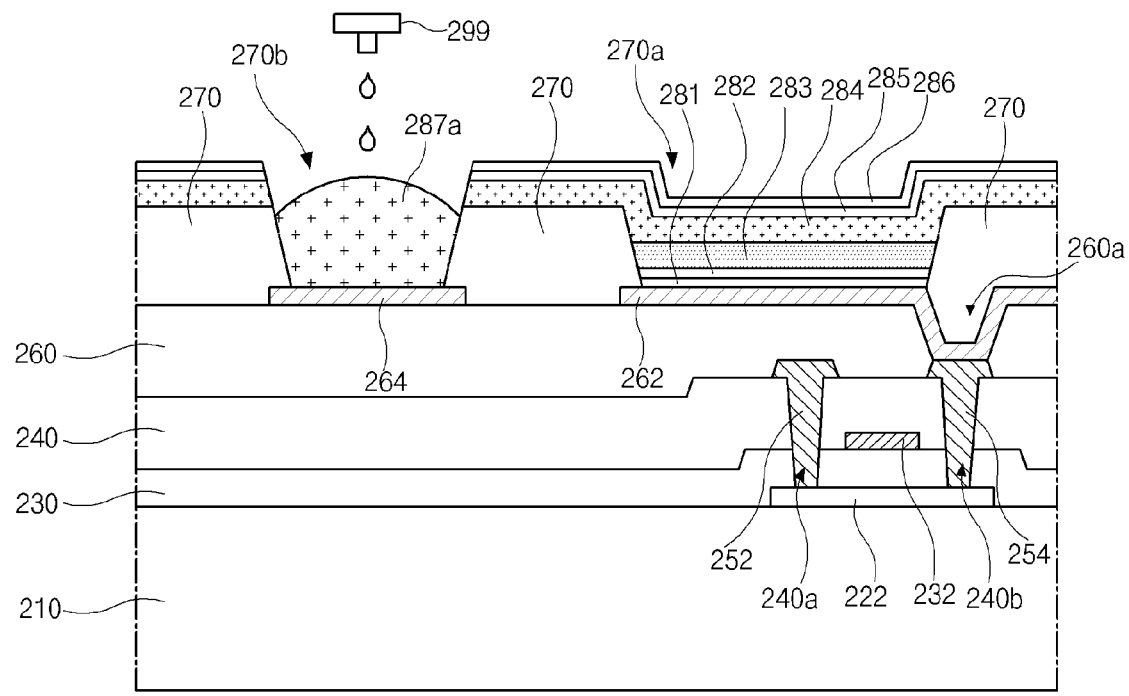

Referring to FIG. 8D, the common layers of the electron injecting material layer 286a of FIG. 8C, the electron transporting material layer 285a of FIG. 8C, and the second light emitting material deposition layer 284a of FIG. 8C on the auxiliary electrode 264 in the auxiliary contact hole 270b are melted by injecting an organic solvent in the auxiliary contact hole 270b using a second injecting apparatus 299. Thus, materials of the common layers are dissolved in the organic solvent, thereby forming a common layer solution 287a in the auxiliary contact hole 270b. At this time, the organic solvent can be injected by an inkjet printing method or a nozzle printing method.

The organic solvent can be one of ethylene glycol, 4-methylanisole, ethyl benzoate, isopropyl alcohol (IPA), acetone, and N-methyl pyrrolidone (NMP). The second light emitting material deposition layer 284a of FIG. 8C, the electron transporting material layer 285a of FIG. 8C and the electron injecting material layer 286a of FIG. 8C on the first electrode 262 become a second light emitting material layer 284, an electron transporting layer 285 and an electron injecting layer 286, respectively.

Figure 8E:
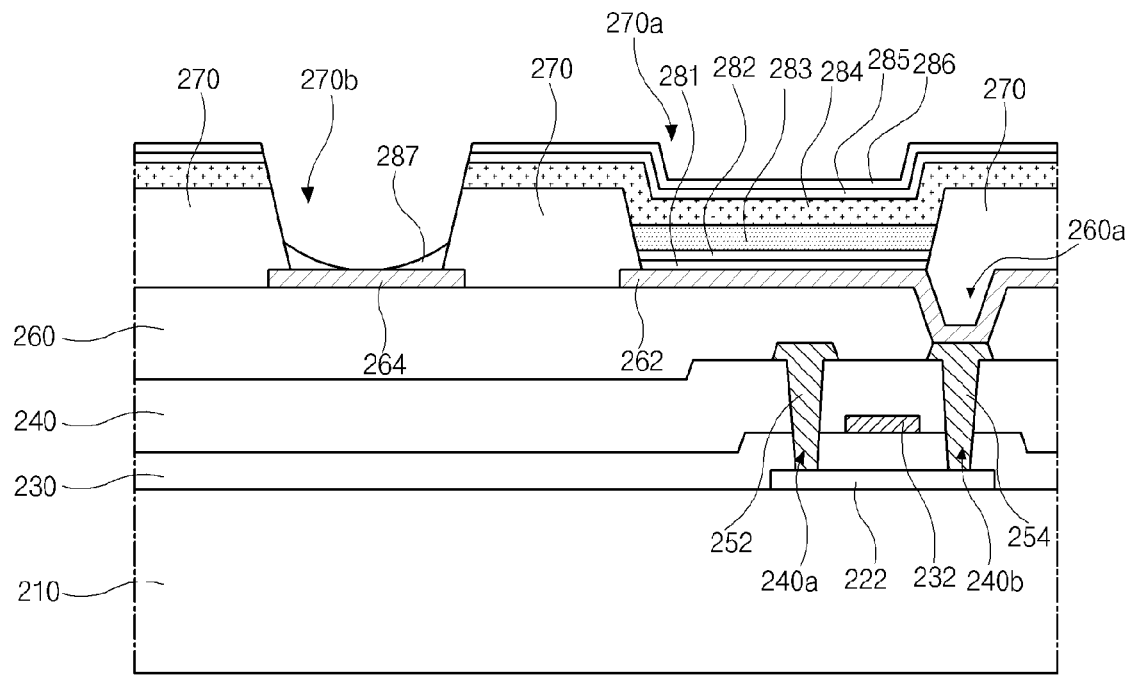

Referring to FIG. 8E, the common layer solution 287a of FIG. 8D is dried to volatilize the organic solvent and the materials of the common layers dissolved in the organic solvent, and a residual layer 287 is formed on the auxiliary electrode 264 by the materials of the common layers not volatilized.

At this time, the residual layer 287 has a thickness increasing from a central portion to an edge portion thereof due to a coffee stain effect or coffee ring effect. The thickness of the edge portion of the residual layer 287 can be 1.1 times or more than the thickness of the central portion of the residual layer 287. Beneficially, the edge portion of the residual layer 287 can be more than about 10 times as thick as the thickness of the central portion of the residual layer 287. Here, the thickness of the central portion of the residual layer 287 can be less than about 50 Å.

Figure 8F:
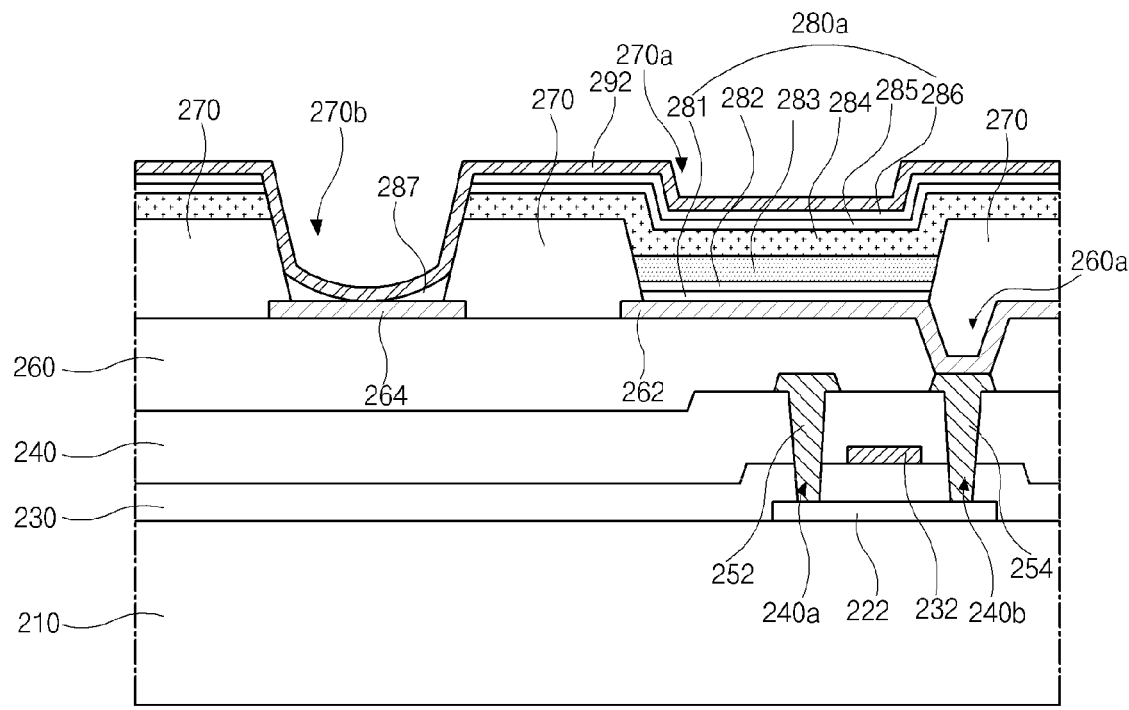

Referring to FIG. 8F, a second electrode 292 is formed on the electron injection layer 286 and the residual layer 287 by depositing a conductive material having relatively low work function over substantially all of the substrate 210 by a sputtering method, for example. The second electrode 292 can be formed of a metallic material such as aluminum, magnesium and silver. The second electrode 292 has a relatively thin thickness such that light is transmitted therethrough.

Here, the second electrode 292 is electrically connected to the auxiliary electrode 264 through the auxiliary contact hole 270b. The second electrode 292 can directly contact the auxiliary electrode 264 or indirectly contact the auxiliary electrode 164 through the residual layer 287. Although the second electrode 292 is connected to the auxiliary electrode 264 through the residual layer 287, the second electrode 292 is electrically connected to the auxiliary electrode 264 because the thickness of the central portion of the residual layer 287 is less than about 50 Å. Here, the OLED display device is a top emission type in which light from the first light emitting layer 280a is output to the outside through the second electrode 292.

In the OLED display device according to the fourth embodiment of the present invention, the auxiliary electrode 264 is connected to the second electrode 292, and the resistance of the second electrode 292 is lowered. At this time, the auxiliary electrode 264 is formed through the same process as the first electrode 262, and an additional process for forming the auxiliary electrode 264 is not required. Additionally, the common layers on the auxiliary electrode 264 are removed by the organic solvent, and the auxiliary electrode 264 and the second electrode 292 can be electrically connected to each other through a simple process.

In the fourth embodiment of the present disclosure, the electron injecting material layer 286a of FIG. 8C, the electron transporting material layer 285a of FIG. 8C, and the second light emitting material deposition layer 284a of FIG. 8C in the auxiliary contact hole 270b are completely melted and then dried, thereby electrically connecting the second electrode 292 and the auxiliary electrode 264. Alternatively, the electron injecting material layer 286a of FIG. 8C, the electron transporting material layer 285a of FIG. 8C, and the second light emitting material deposition layer 284a of FIG. 8C in the auxiliary contact hole 270b can be partially melted and then dried, thereby electrically connecting the second electrode 292 and the auxiliary electrode 264.

According to embodiments of the OLED display device of the present disclosure, light emitting from the light emitting layer is output to the outside through the second electrode. As a result, the OLED display device in which light is output to the outside through the second electrode has a relatively high aperture ratio, large size and high definition. Because the second electrode is connected to the auxiliary electrode, the resistance of the second electrode is lowered, and the brightness is uniform.

In further detail, according to embodiments of the present disclosure, the manufacturing process of the OLED display device is simplified due to the auxiliary electrode being formed of the same material and on the same layer as the first electrode. Also, according to embodiments of the present disclosure, the manufacturing process of the OLED display device is simplified because the common layers on the auxiliary electrode are removed using the organic solvent, and the second electrode is connected to the auxiliary electrode. Accordingly, the manufacturing costs of the OLED display device are also reduced.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. A method of fabricating an organic light emitting diode display device, the method comprising:
    forming a thin film transistor on a substrate;
    forming a passivation layer on the thin film transistor;
    forming a first electrode and an auxiliary electrode on the passivation layer, the first electrode connected to a drain electrode of the thin film transistor, and the auxiliary electrode spaced apart from the first electrode;
    forming a bank layer having a transmissive hole exposing the first electrode and an auxiliary contact hole exposing the auxiliary electrode;
    sequentially forming a hole injecting material layer and a hole transporting material layer over the substrate including the bank layer;
    forming a light emitting material layer on the hole transporting material layer corresponding to the transmissive hole;
    sequentially forming an electron transporting material layer and an electron injecting material layer over the substrate including the light emitting material layer;
    selectively melting and drying the electron injecting material layer, the electron transporting material layer, the hole transporting material layer and the hole injecting material layer corresponding to the auxiliary contact hole using an organic solvent while the electron injecting and transporting material layers and the hole injecting and transporting material layers corresponding to the transmissive hole remain intact, thereby forming a residual layer on the auxiliary electrode in the auxiliary contact hole and forming a hole injecting layer, a hole transporting layer, an electron transporting layer and an electron injecting layer corresponding to the light emitting material layer in the transmissive hole,
    wherein a thickness of a central portion of the residual layer is smaller than a thickness of an edge portion of the residual layer at the auxiliary contact hole; and
    forming a second electrode on the electron injecting layer and the residual layer,
    wherein the second electrode is electrically connected to the auxiliary electrode through the central portion of the residual layer at the auxiliary contact hole.

2. The method of claim 1, wherein the forming the hole injecting material layer, the hole transporting material layer, the light emitting material layer, the electron transporting material layer and the electron injecting material layer includes forming each layer are formed by a vacuum deposition method.

3. The method of claim 1, wherein the light emitting material layer is formed over the substrate, and
    wherein the forming the residual layer includes selectively melting and drying the light emitting material layer corresponding to the auxiliary contact hole using the organic solvent.

4. The method of claim 1, wherein the selectively melting and drying includes injecting the organic solvent by an inkjet printing method or a nozzle printing method.

5. The method of claim 1, wherein the forming the residual layer includes controlling the thickness of the central portion of the residual layer at the auxiliary contact hole to be less than 200 Å to electrically connect the second electrode to the auxiliary electrode through the central portion of the residual layer at the auxiliary contact hole.

6. The method of claim 1, wherein the thickness of the edge portion of the residual layer is more than 1.1 times the thickness of the central portion of the residual layer.

* * * * *